(12) United States Patent
Shirakawa et al.

(10) Patent No.: US 9,396,775 B2
(45) Date of Patent: Jul. 19, 2016

(54) SEMICONDUCTOR MEMORY DEVICE INCLUDING A CONTROL CIRCUIT AND AT LEAST TWO MEMORY CELL ARRAYS

(71) Applicant: KABUSHIKI KAISHA TOSHIBA, Tokyo (JP)

(72) Inventors: Masanobu Shirakawa, Chigasaki Kanagawa (JP); Tokumasa Hara, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 14/475,493

(22) Filed: Sep. 2, 2014

(65) Prior Publication Data
US 2015/0262630 A1    Sep. 17, 2015

(30) Foreign Application Priority Data

Mar. 14, 2014    (JP) ................................. 2014-051876

(51) Int. Cl.
| | |
|---|---|
| G06F 12/00 | (2006.01) |
| G11C 7/10 | (2006.01) |
| G06F 12/08 | (2016.01) |
| G06F 13/16 | (2006.01) |
| G11C 7/24 | (2006.01) |

(52) U.S. Cl.
CPC .......... *G11C 7/1063* (2013.01); *G06F 12/0875* (2013.01); *G06F 13/16* (2013.01); *G06F 2212/452* (2013.01); *G11C 7/24* (2013.01)

(58) Field of Classification Search
CPC .... G11C 7/1063; G11C 7/24; G06F 12/0875; G06F 2212/452
USPC .................................................... 711/125, 156
See application file for complete search history.

(56) References Cited

U.S. PATENT DOCUMENTS 9,093,132 B2 *   7/2015   Kim ..................... G11C 7/1063
9,105,317 B2 *   8/2015   Eom ................... H03K 19/0005

FOREIGN PATENT DOCUMENTS

JP    2009-266946 A    11/2009

* cited by examiner

*Primary Examiner* — Jasmine Song
(74) *Attorney, Agent, or Firm* — Patterson & Sheridan, LLP

(57) ABSTRACT

A memory device includes first and second memory cell arrays, and a control circuit configured to output first information indicating whether the first memory cell array is in a ready state in which the control circuit is ready to receive a command to access the first memory cell array or a busy state in which the control circuit is not ready to receive the command to access the first memory cell array, and second information indicating whether the second memory cell array is in a ready state in which the control circuit is ready to receive a command to access the second memory cell array or a busy state in which the control circuit is not ready to receive the command to access the second memory cell array.

15 Claims, 19 Drawing Sheets

FIG. 17

|  | Status | Output |
| --- | --- | --- |
| I/O[0] | Not used | '0' |
| I/O[1] | PB0 True ready/busy | 'Ready:'1'Busy:'0' |
| I/O[2] | PB1 True ready/busy | 'Ready:'1'Busy:'0' |
| I/O[3] | True ready/busy | 'Ready:'1'Busy:'0' |
| I/O[4] | PB0 Cache ready/busy | 'Ready:'1'Busy:'0' |
| I/O[5] | PB1 Cache ready/busy | 'Ready:'1'Busy:'0' |
| I/O[6] | Cache ready/busy | 'Ready:'1'Busy:'0' |
| I/O[7] | Write protect | Protect:'0'Not protect '1' |

FIG. 18

|  | Status | Output |
|---|---|---|
| I/O[0] | Chip N status | Pass:'0'Fail:'1' |
| I/O[1] | Chip N-1 status | Pass:'0'Fail:'1' |
| I/O[2] | Not used | '0' |
| I/O[3] | Not used | '0' |
| I/O[4] | Queue busy | 'Ready:'1'Busy:'0' |
| I/O[5] | True busy | 'Ready:'1'Busy:'0' |
| I/O[6] | Cache busy | 'Ready:'1'Busy:'0' |
| I/O[7] | Write protect | Protect:'0'Not protect '1' |

FIG. 19

|  | Status | Output |
|---|---|---|
| I/O[0] | Chip N status | Pass:'0'Fail:'1' |
| I/O[1] | Chip N-1 status | Pass:'0'Fail:'1' |
| I/O[2] | Not used | '0' |
| I/O[3] | Not used | '0' |
| I/O[4] | True busy | 'Ready':'1'Busy:'0' |
| I/O[5] | Cache busy 2 | 'Ready':'1'Busy:'0' |
| I/O[6] | Cache busy 1 | 'Ready':'1'Busy:'0' |
| I/O[7] | Write protect | Protect:'0'Not protect '1' |

SEMICONDUCTOR MEMORY DEVICE INCLUDING A CONTROL CIRCUIT AND AT LEAST TWO MEMORY CELL ARRAYS

CROSS-REFERENCE TO RELATED APPLICATION

This application is based upon and claims the benefit of priority from Japanese Patent Application No. 2014-051876, filed Mar. 14, 2014, the entire contents of which are incorporated herein by reference.

FIELD

Embodiments described herein relate generally to a semiconductor memory device.

BACKGROUND

A semiconductor memory device may have a plurality of planes each including a set of a memory cell array, a decoder, a read circuit, and the like. If the plurality of planes is properly controlled, it is possible for the memory device to be efficiently used.

DESCRIPTION OF THE DRAWINGS

FIG. 17 illustrates an allocation example of a bit of status data according to the third embodiment;

FIG. 18 illustrates a second allocation example of the bit of the status data according to the third embodiment; and FIG. 19 illustrates a third allocation example of the bit of the status data according to the third embodiment.

DETAILED DESCRIPTION

Figure 1:
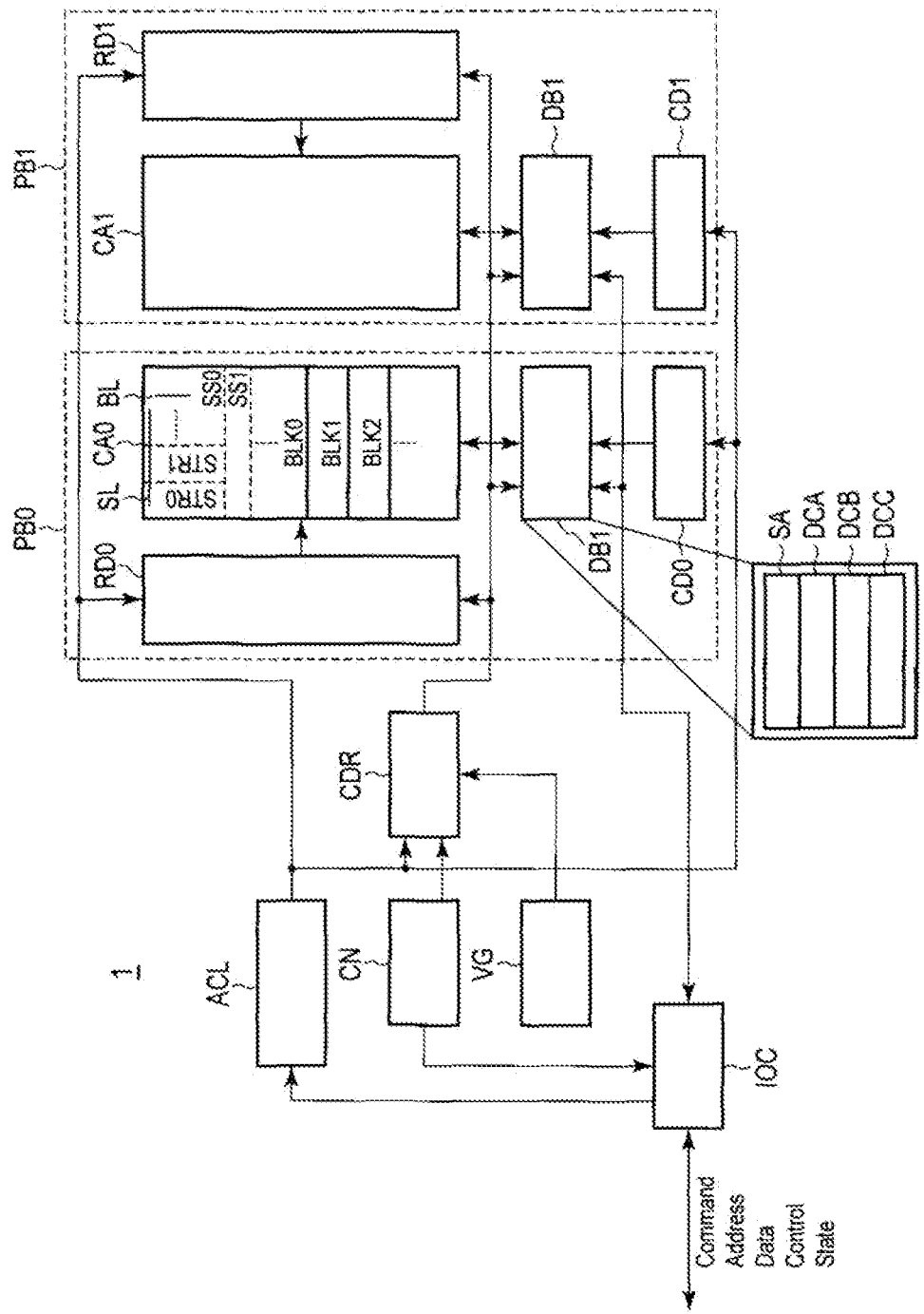
FIG. 1 illustrates functional blocks of a memory device according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

The embodiment provides a semiconductor memory device which may be efficiently controlled.

In general, according to one embodiment, a memory device includes first and second memory cell arrays, and a control circuit configured to output first information indicating whether the first memory cell array is in a ready state in which the control circuit is ready to receive a command to access the first memory cell array or a busy state in which the control circuit is not ready to receive the command to access the first memory cell array, and second information indicating whether the second memory cell array is in a ready state in which the control circuit is ready to receive a command to access the second memory cell array or a busy state in which the control circuit is not ready to receive the command to access the second memory cell array.

A memory device including a plurality of planes further includes a peripheral circuit common to the plurality of planes. The memory device including the plurality of planes and the peripheral circuit is formed as a single chip, for example. A memory controller which controls the memory device designates a single-plane read which is a read from one plane and multi-reads from the plurality of planes. In this manner, the memory device may perform the single-plane read and the multi-reads.

The memory device uses a ready/busy signal to show the memory controller whether the memory device is either in a ready state or in a busy state. The ready state represents a state where the controller may have access to the memory device. The busy state represents a state where the memory device internally performs a certain process and consequently the controller does not have access to the memory device. However, even when the memory device is in the busy state, processes during the busy state may include a process in which a first plane is involved, but a second plane is not involved. Even in such a case, the memory device outputs a busy signal. Accordingly, the memory device does not receive a command in which the second plane is involved while the memory device outputs the busy signal. This means that the plurality of planes are not effectively utilized.

Hereinafter, embodiments will be described with reference to the drawings. In the following description, the same reference numerals are given to configuring elements having substantially the same function and configuration, and thus repeated description thereof will be made only when necessary.

Each functional block may be executed by either hardware or computer software, or alternatively by combining both of these. Therefore, the functional block will be described below in viewpoint of the function thereof. It is not essential to divide each functional block as in the following example. A partial function may be executed by a functional block different from the illustrated example, or a certain functional block may be divided into sub-functional blocks.

In the description, when the reference numerals include a set of a first element consisting of numbers or alphabets and a second element consisting of continuing alphabets or continuing numbers without or with subsequent hyphens or subsequent under bars, the second element enables the first element of the same type to be distinguished. When it is not necessary to distinguish the first element, reference numerals omitting the second element will be used. The description represents all the reference numerals only for the first element.

First Embodiment

Figure 2:
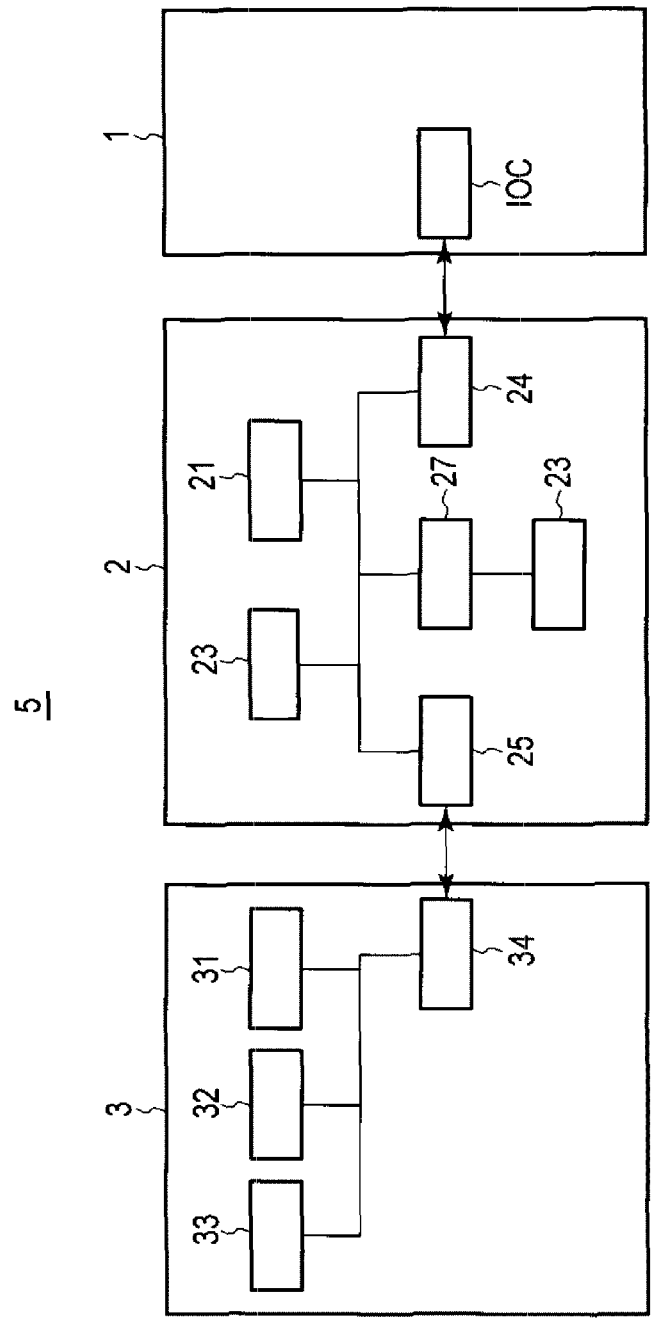
FIG. 2 illustrates a system including the memory device according to the first embodiment.

FIG. 1 illustrates functional blocks of a semiconductor memory device according to a first embodiment. As illustrated in FIG. 2, a semiconductor memory device 1 is controlled by a memory controller 2. The memory controller 2 is further controlled by a host device 3, for example, a personal computer (PC). FIG. 2 illustrates a system according to the first embodiment. A memory system 5 includes the memory device 1, the memory controller 2, and the host device 3. For example, the memory controller 2 includes elements such as a processor 21 of a central processing unit (CPU), a read only memory (ROM) 22, a random access memory (RAM) 23, and interfaces 24, 25, 27. The memory controller 2 performs various operations in such a manner that the processor 21 executes a program held by the ROM 22, for example. That is, a file system function of the memory controller 2 is executed by the program executed by the processor 21. The file system performs management on the memory device and the data stored in the memory device 1. In addition, the program executed by the processor 21 executes a driver of the interfaces 24, 25, 27. The driver controls the interfaces 24, 25, and 27. The memory interface 24 controls communication of the memory controller 2 (processor 21) with the memory device 1. The host interface 25 controls communication of the memory controller 2 (processor 21) with the host device 3. The RAM interface 27 controls communication of the processor 21 with the RAM 23. The RAM 23 holds temporary data.

Similarly, the host device 3 also includes elements such as a processor 31 of the CPU, a ROM 32, a RAM 33, and an interface 34, for example. The host device 3 performs various operations in such a manner that the processor 31 executes a program held by the ROM 32, for example. The interface 34 controls communication with the memory controller 2.

Referring back to FIG. 1, the memory device 1 includes elements such as a plurality of planes (two planes PB0 and PB1 are illustrated as an example), a control circuit CN, an input-output circuit IOC, an address-command register ACL, a voltage generating circuit VG, and a core driver CDR. Each plane PB includes a cell array CA, a row decoder RD, a data circuit-page buffer DB, and a column decoder CD.

The cell array CA includes a plurality of blocks BLK. Each block BLK includes a plurality of string groups SS. Each string group SS includes a plurality of strings STR. Each string STR includes a plurality of memory cells MC (not illustrated). In addition to this, elements such as a word line WL, a bit line BL, and a source line SL are disposed in the cell array CA.

The input-output circuit IOC controls an input of a command, an address, data, and control signal from the memory controller 2 or an output to the memory controller 2. The command, the address, and the data are transmitted onto an I/O line between the input-output circuit IOC and the memory controller 2. For example, the control signal includes command latch enable (CLE), address latch enable (ALE), write enable (WE), and read enable (RE).

The row decoder RD receives a block address signal from the address-command register ACL, and in addition, receives a word line voltage or a selection gate voltage from the core driver CDR. Based on the received block address signal, a string address signal, a word line control signal, and a selection gate line control signal, the row decoder RD selects a block, a string group, a word line and the like.

The data circuit-page buffer DB temporarily holds the data read from the memory cell array CA, receives write data from outside of the memory device 1, and writes the received data on the selected memory cell MC. The data circuit-page buffer DB includes a sense amplifier SA. The sense amplifier SA includes a plurality of sense amplifier units respectively connected to the plurality of bit lines BL. The sense amplifier SA reads the data of the memory cell MC via the bit line BL, and detects a state of the memory cell MC via the bit line BL. The memory device 1 may hold the data of two or more bits in one memory cell MC.

The data circuit-page buffer DB includes a plurality of (for example, three) data caches DCA, DCB, and DCC. The column decoder CD receives a column address signal from the address-command register ACL, and decodes the received column address signal. Based on the decoded address signal, the column decoder CD controls an input and an output of the data of the data circuit-page buffer DB.

The control circuit CN receives various commands from the address-command register ACL. The control circuit CN controls the voltage generating circuit VG and the core driver CDR in accordance with a predetermined sequence, based on the command. The voltage generating circuit VG generates various voltages (potentials) in accordance with an instruction of the control circuit CN. The core driver CDR controls the row decoder RD and the data circuit-page buffer DB in order to control the word line WL and the bit line BL in accordance with the instruction of the control circuit CN.

The control circuit CN outputs a signal indicating a state of the memory device 1 to the memory controller 2 via the input-output circuit IOC. The signal indicating this state includes cache busy signals CBUSY0 and CBUSY1. High level signals BUSY, CBUSY0, and CBUS1 indicate a ready state, and low level signals BUSY, CBUSY0, and CBUSY1 indicate a busy state. The signals CBUSY0 and CBUSY1 will be described later.

Figure 3:
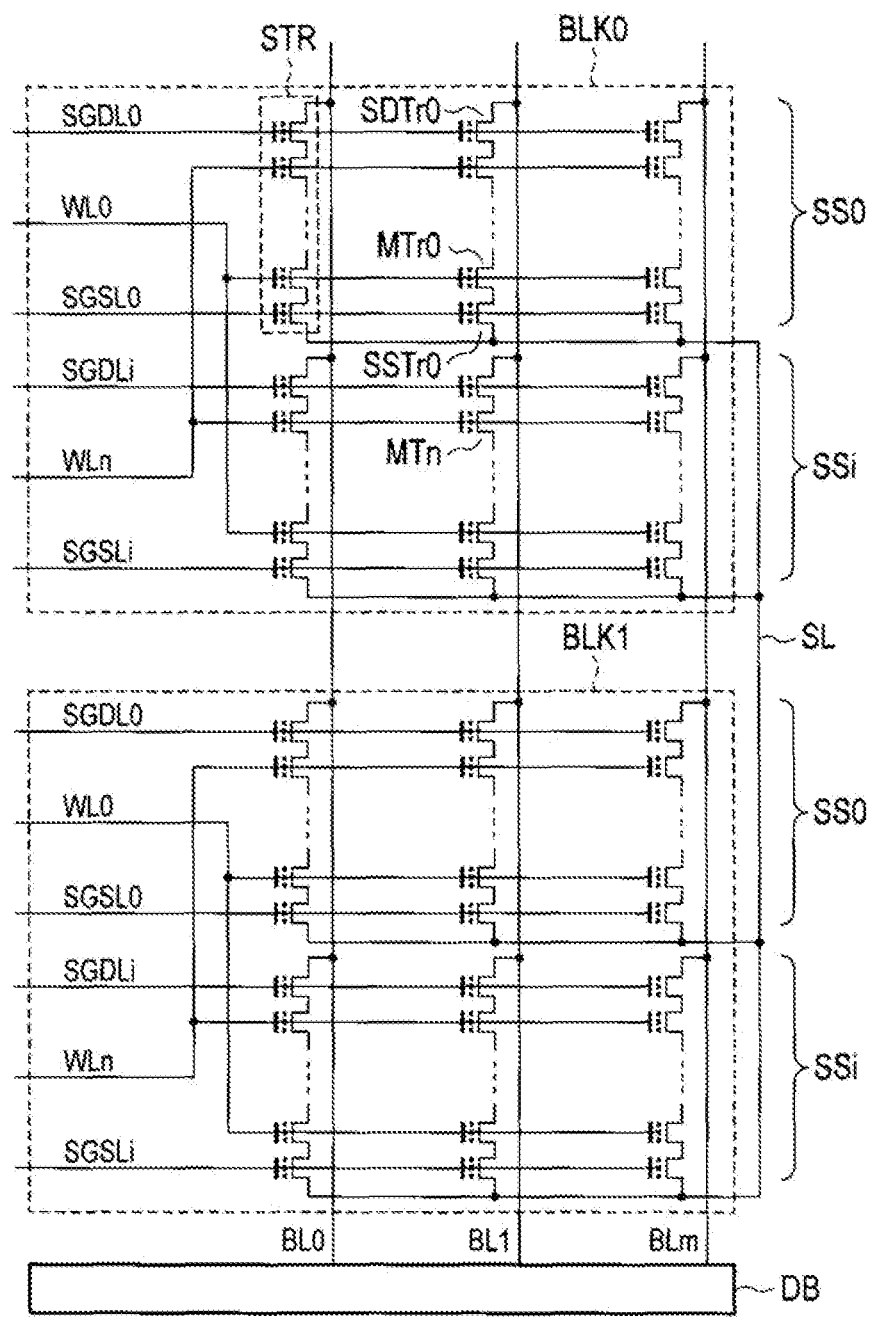
FIG. 3 is a circuit diagram of a part of a memory cell array according to the first embodiment.

The cell array CA has the elements and connections which are illustrated in FIG. 3. FIG. 3 is a circuit diagram of a part (two blocks BLK) of the cell array according to the first embodiment. As described above, the cell array CA includes the plurality of blocks BLK. Each block BLK includes the plurality of string groups SS. Each string group SS includes the plurality of strings STR. In addition, the cell array CA includes the plurality of bit lines BL and a cell source line SL. In each block BLK, i+1 numbers of strings STR are connected to one bit line BL. The variable i is 0 or a natural number.

One string STR has n+1 numbers of memory cell transistors MTr0 to MTrn which are connected in series, a source side selection gate transistor SSTr, and a drain side selection gate transistor SDTr. The variable n is 0 or the natural number, for example 15. In each string STR, a drain of the transistor SSTr is connected to a source of the cell transistor MTr0. A source of the transistor SDTr is connected to a drain of the cell transistor MTr15. A source of the transistor SSTr is connected to the source line SL. A drain of the transistor SDTr is connected to one corresponding bit line BL.

The plurality of strings STR juxtaposed along an extending direction of the word line WL makes up the string group SS. For example, all the strings STR which are juxtaposed in the extending direction of the word line WL and are respectively connected to all the bit lines BL make up one string group SS.

In each string group SS, respective gates of the respective cell transistors MTrX (the sign X is 0 or the natural number) of the plurality of strings STR are connected to the word line WLX in common.

In each string group SS, respective gates of the respective transistors SDTr of the plurality of strings STR are connected to a drain side selection gate line SGDL in common. Selection gate lines SGDL0 to SGDLi are respectively disposed for the string group SS0 to the string group SSi.

In each string group SS, respective gates of the respective transistors SSTr of the plurality of strings STR are connected to a source side selection gate line SGSL in common. The source side selection gate lines SGSL0 to SGSLi are respectively disposed for the string group SS0 to the string group SSi.

A structure of the memory cell array CA is disclosed in U.S. patent application Ser. No. 12/407,403 filed on Mar. 19, 2009, entitled "Three-dimensional stacked non-volatile semiconductor memory". In addition, the structure is disclosed in U.S. patent application Ser. No. 12/406,524 filed on Mar. 18, 2009, entitled "Three-dimensional stacked non-volatile semiconductor memory", in U.S. patent application Ser. No. 12/679,991 filed on Mar. 25, 2010, entitled "Non-volatile semiconductor storage device and method of manufacturing the same", and in U.S. patent application Ser. No. 12/532,030 filed on Mar. 23, 2009, entitled "Semiconductor memory and method for manufacturing same". These patent applications are hereby incorporated by reference in its entirety.

The cell transistors MTr connected to one word line WL of the same one of the strings STR out of one string group SS make up a physical unit. A storage space of one physical unit equals one or more pages. Data is read on a page-by-page basis. Write may be executed on each page, or may be executed on each physical unit.

In each block BLK, the word lines WLX having the same number (address) in different strings STR are connected to each other.

In order to have access to the cell transistor MTr, one block BLK is selected, and one string group SS is selected. In order to select the block BLK, a signal for selecting the block BLK is supplied only to the block BLK specified by a block address signal. In the selected block BLK, this memory block selection signal causes the word line WL, and the selection gate lines SGSL and SGDL to be connected to a driver in the core driver CDR.

Furthermore, in order to select one string group SS, the selection gate transistors SSTr and SDTr of the selected string group SS receive a voltage for selection. In the non-selected string group SS, the selection gate transistors SSTr and SDTr receives a voltage for non-selection. The voltage for selection is dependent on the read operation and the write operation. Similarly, the voltage for non-selection is dependent on the read operation and the write operation.

Figure 4:
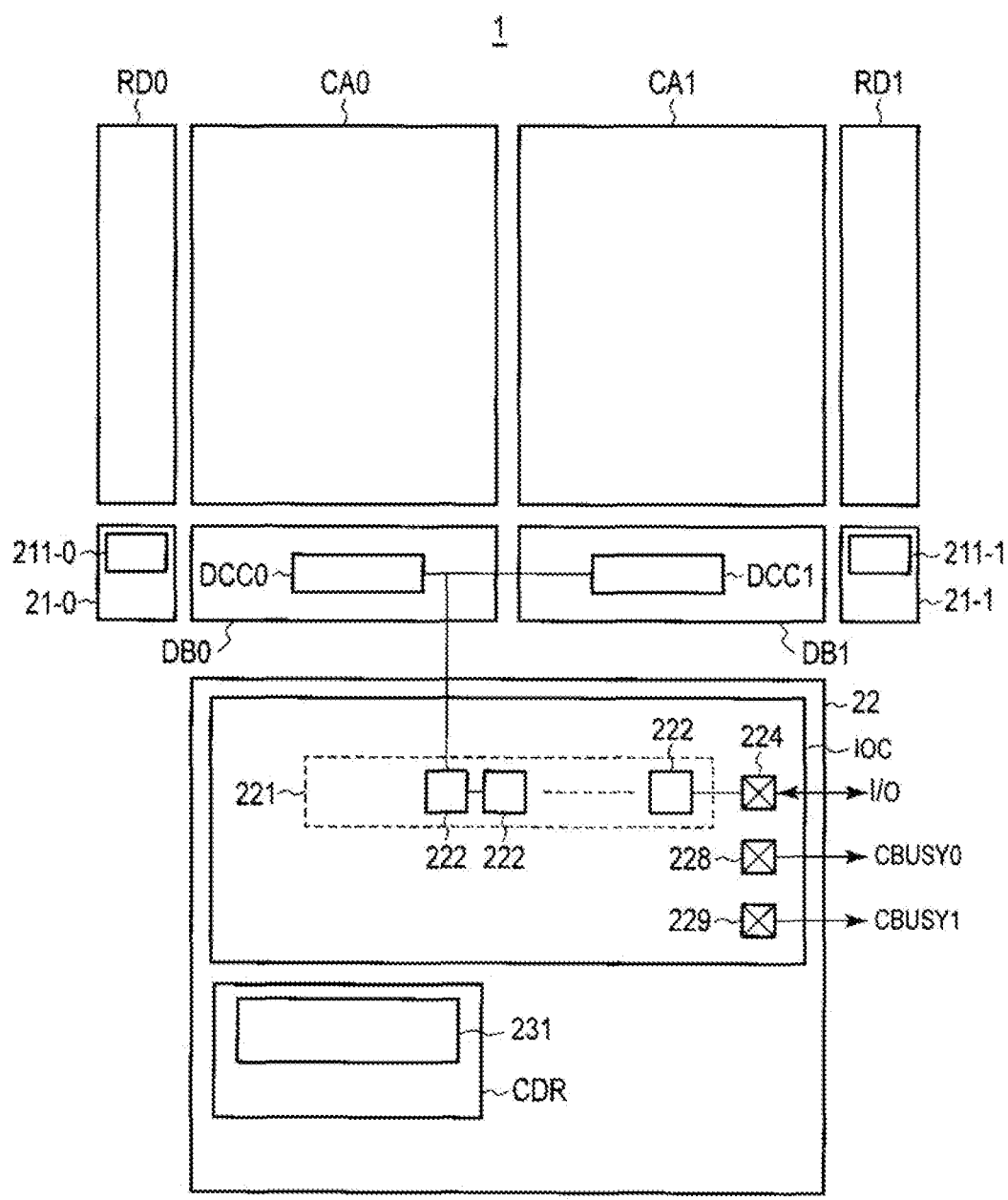
FIG. 4 illustrates functional blocks of a part of the memory device according to the first embodiment.

FIG. 4 illustrates functional blocks of a part of the memory device according to the first embodiment, and is an extract of several functional blocks illustrated in FIG. 1. In addition, FIG. 4 also illustrates layout of the functional blocks. A peripheral circuit 220 is an aggregate of the elements shared by the planes PB0 and PB1 illustrated in FIG. 1, and includes at least the input-output circuit IOC and the core driver CDR. The input-output circuit IOC includes a shift register 221, an input-output pad 224, and cache busy pads 228 and 229. The input-output pad 224 is connected to the I/O line. The shift register 221 includes a plurality of register elements (data holding elements) 222. Each of the register elements 222 holds a portion having a predetermined size of the data transmitted from a data cache DCC. The shift register 221 causes the data portion transmitted from the data cache DCC to be shifted from the respective register elements 222 to the register element 222 in the downstream close to the input-output pad 224. The core driver CDR includes a conversion determination circuit 231. The determination circuit 231 will be described later.

A corner region 21 is provided independently for the planes PB0 and PB1, and includes an address register 211. The cache busy pads 228, 229 respectively output the cache busy signals CBUSY0 and CBUSY1.

Figure 5:
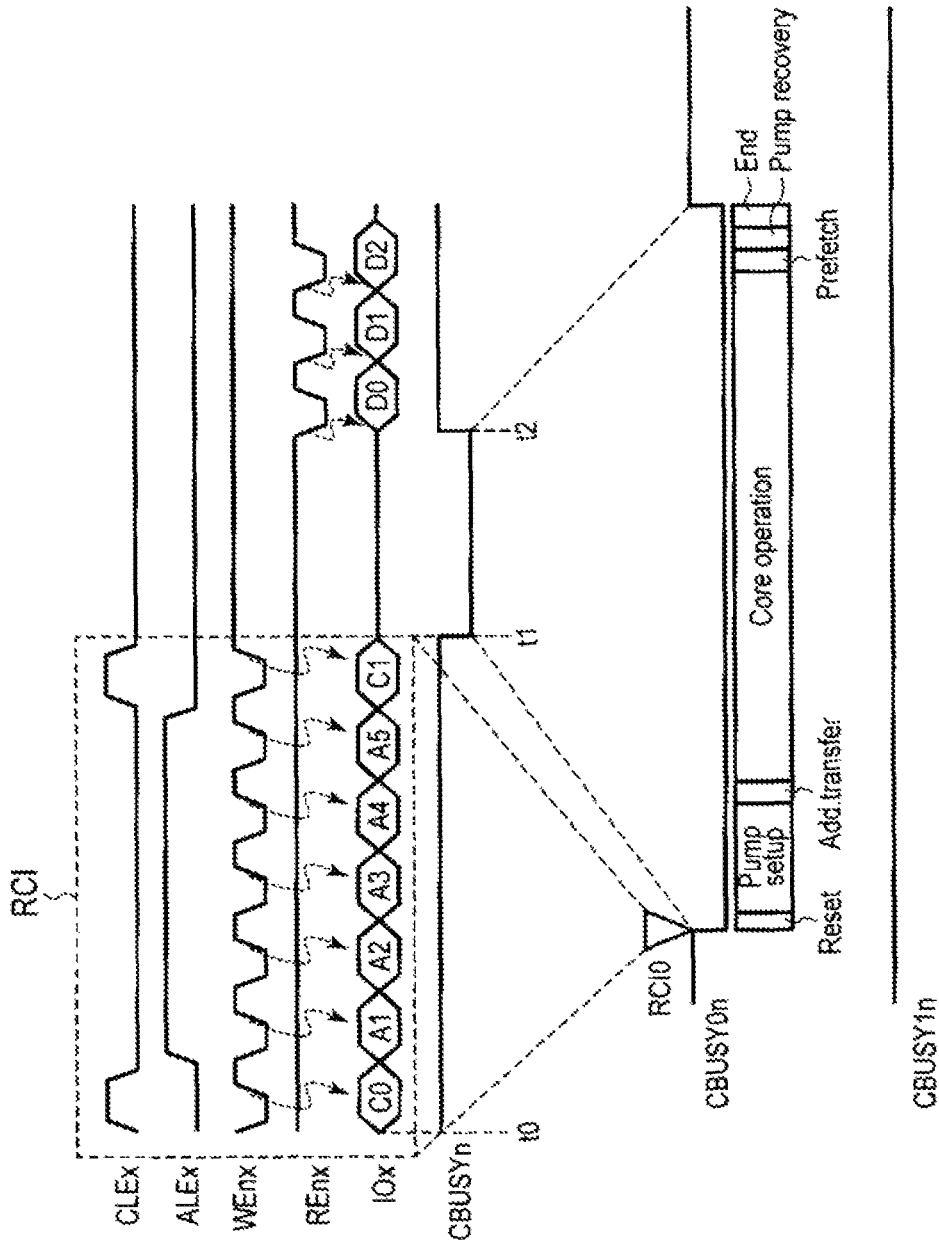
FIG. 5 illustrates an example of an operation of the memory device according to the first embodiment.

Next, referring to FIGS. 5 to 11, an operation of the memory device according to the first embodiment will be described. FIG. 5 illustrates an example of the operation of the memory device according to the first embodiment, and illustrates a signal flowing between the memory device 1 and the memory controller 2. FIG. 5 illustrates an example of a so-called single-plane read. In order to read the data in the memory device 1, the memory device 1 receives the signal illustrated in FIG. 5 from the memory controller 2, and outputs the signal illustrated in FIG. 5 to the memory controller 2.

When the read is executed, the input-output circuit IOC receives a command C0, addresses A1 to A5, and a command C1, on the I/O line over the times t0 to t1. At the same time, the input-output circuit IOC receives WE which is shifted between a high level and a low level at specific timing. WE represents the timing for acquiring the signal on the I/O line. The input-output circuit IOC uses an edge of WE to recognize a break of the signal on the I/O line, and acquires the command C0, the addresses A1 to A5, and the command C1.

The input-output circuit IOC further receives CLE of a high level and ALE of a high level. CLE and ALE of the high level indicate that the signals flowing on the I/O line at the same time are respectively the command and the address.

The command C0 indicates that the address of a read target is followed. The command C1 instructs execution of the read. The addresses A1 and A2 are column addresses which are column portions within the address of the read target. The addresses A3 to A5 are row portions within the address of the read target, and for example, are row addresses for specifying the plane, the block, the string, and the page of the read target. In the following description and in FIG. 5, the addresses A3 to A5 designate the plane PB0. That is, a set of the command C0, the addresses A1 to A5, and the command C1 designates the single-plane read. In the following description, a set of inputs of the read command and the address during the times t0 to t1 is referred to as a read command input RCI.

In response to the receipt of a read execution command, the core driver CDR reads the data from the address of the read target through the row decoder RD0 for the plane PB0, the data circuit-page buffer DB0, and the column decoder CD0. The read is executed over the times t1 to t2.

For example, the read includes reset, pump setup, address transfer, a core operation, pre-fetch, and pump recovery. The reset indicates initialization of operations involved in the read. The pump setup indicates generation of electric potential for the read by using the voltage generating circuit VG. The address transfer includes the transfer of the addresses A1 to A5 to the address register 211 in a corner region 21-0. The core operation includes at least application of predetermined electric potential to the word line WL, the selection gate lines SGDL and SGSL, amplification of the electric potential based on the data read on the bit line BL by using the sense amplifier SA, identification of the data, and holding of the data caches DCA, DCB, and DCC of the data. The pre-fetch includes transfer of the data of the data cache DCC of the column address designated by the (column) addresses A1 and A2 to the shift register 221. That is, the pre-fetch causes the column address data designated by the column addresses A1 and A2 to be set in the shift register 221. The pump recovery includes initialization of the voltage generating circuit VG.

When the read is executed, the control circuit CN outputs the signal CBUSY0 indicating the busy state. The control circuit CN outputs the respective signals CBUSY indicating the ready state and the busy state while the cache DCC for the plane PB0 is accessible and inaccessible. The signal CBUSY indicates a state where the cache DCC is accessible. The memory device 1 holds the data in the data caches DCA and DCB by using the core operation, when one read (one read command) is executed. Subsequently, the memory device 1 transfers the data in the data caches DCA and DCB to the data cache DCC by using the pre-fetch or a dedicated command. The memory device 1 transfers the data in the data cache DCC to the shift register 221, and prepares the output data from the shift register 221 to the input-output pad 224. In a case of read, a state where the data read through the core operation is set in the data cache DCC and the data in the data cache DCC is accessible is referred to as a cache ready state. In other words, as will be described later using a specific case, the cache ready state is a state where the memory device 1 may receive a command (for example, a read command, a program command, and an erase command) instructing a process (access to the plane PB) which is in the cache ready state. For example, even during a certain process in the first plane PB, if the second plane PB is in the cache ready state, the memory device 1 receives the command instructing the process (access to the second plane) in the second plane PB.

In contrast, when the read is executed, the plane PB1 is not accessed. Accordingly, the data cache DCC of the plane PB1 is also not accessed. Therefore, when the read is executed, the control circuit CN maintains the signal CBUSY1 for the plane PB1 to have a value indicating the ready state.

If the core operation of the read is completed at time t1, the control circuit CN changes the signal CBUSY0 to the ready state. In response to the signal CBUSY0 changed to the ready state, the memory controller 2 repeatedly switches RE over to a high level and a low level at predetermined timing (toggle RE). When detecting an edge of RE, the input-output circuit IOC outputs the data in the register element 222 which is closest to the input-output pad 224 within the shift register 221 to the I/O line. The input-output circuit IOC transfers the data in each register element 222 to the register element 222 in one-step downstream side, and repeats this procedure for every edge of RE. As a result, the data D0 to D2 flows to the memory controller 2 on the I/O line.

Figure 6:
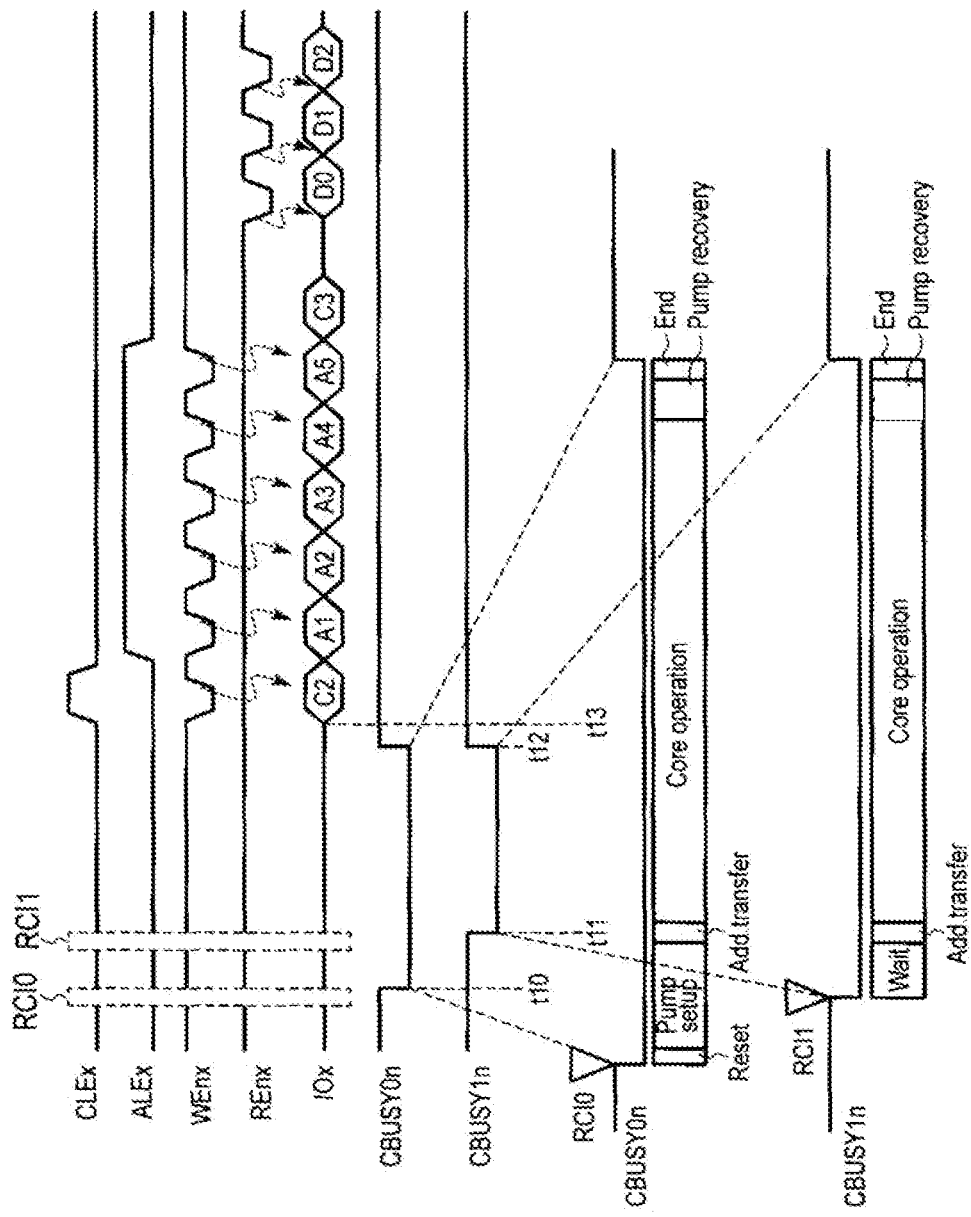
FIG. 6 illustrates a second example of the operation of the memory device according to the first embodiment.

FIG. 6 illustrates a second example of the operation of the memory device according to the first embodiment, and illustrates a signal flowing between the memory device 1 and the memory controller 2. The memory device 1 receives a read command input RC10 which designates the plane PB0 as the read target at time t10. In this manner, the core driver CDR starts the read from time t10, and causes the signal CBUSY0 for the plane PB0 of the read target to be in the busy state. Details of the read are as described hereinbefore with reference to FIG. 5.

At time t11, the memory device 1 receives a read command input RCI1 which designates the plane PB1 as the read target. At this time point, the memory device 1 is in the midst of executing the read for a read command input RCI0. The memory device 1 receives the read command input RCI1, if the cache busy signal CBUSY1 regarding the plane PB1 designated by the subsequent read command input RCI1 indicates the ready state. The memory device 1 separately performs a process of the subsequent read command input RCI1, based on the combination of several conditions. The process performed in response to the subsequent read command input RCI1 is as follows.

First, without resetting the data caches DCA, DCB, DCC of the plane (plane PB1) designated by the subsequent read command input RCI1, the core driver CDR maintains the data thereinside. In addition, the core driver CDR interprets the command in the subsequent read command input RCI1, and proceeds to perform the process based on the interpretation. The conversion determination circuit 231 determines whether the completion of the read command input RCI1 (completion of receipt of the command C1) is done before the start of the core operation regarding the preceding read command input RCI0, that is, before the address transfer, and whether the page of the read target designated by the subsequent read command input RCI1 is the same as the page of the read target designated by the preceding read command input RCI0. If a certain physical unit provides a storage space for a plurality of pages, only one word line WL is associated with the physical unit. However, consequently, a plurality of page addresses is allocated thereto. In this case, in order to determine that two read target pages are coincident with each other, it is not enough to cause the word lines WL to be coincident with each other. Accordingly, coincidence of positions of the page is also required. More specifically, for example, if one physical unit provides two storage spaces for an upper page and a lower page, two read targets are necessarily the upper pages or the lower pages. The strings are not necessarily the same as each other. That is, the multi-plane read has a limitation on the coincidence of the read target addresses or pages. When two read command inputs RCI0 and RCI1 instruct the access satisfying the limitation, and when timing requirements are satisfied, the two read command inputs RCI0 and RCI1 are converted into the multi-plane read.

If the reception of the subsequent read command input RCI1 is performed before the transfer of the address for a read command input RCI0 and two read target pages are coincident with each other, the conversion determination circuit 231 determines that the process of the read command inputs RCI0 and RCI1 is performed by means of the multi-plane read. In the multi-plane read, the planes PB0 and PB1 are controlled in synchronization with each other. For the synchronization starting from the address transfer, the core driver CDR suspends the process in the plane PB1, and waits for the start of the address transfer in the plane PB0. If the pump setup is completed, the core driver CDR transfer the respective read target addresses of the planes PB0 and PB1 to the address register in the corner regions 21-0 and 21-1, respectively at the same time. Next, the core driver CDR performs the core operations in the planes PB0 and PB1 at the same time, and reads the data to the data caches DCC0 and DCC1 of the respective planes PB0 and PB1. Thereafter, the core driver CDR completes the read by performing the recovery of the pump. At the same time, the control circuit CN causes the signals CBUSY0 and CBUSY1 to be respectively in the busy state.

In general, the multi-plane read does not include the pre-fetch. The use of the shift register 221 is shared by the planes PB0 and PB1. The reason is because the plane is not determined without any designation on which plane data is to be transferred to the shift register. Therefore, after the multi-plane read, the memory controller 2 designates the plane on which the data transfer is to be performed from the data cache DCC to the shift register 221. That is, the command C2 and CLE of the high level are transmitted from time t13, then the addresses A1 to A5 and ALE of the high level are transmitted, and WE is toggled. The row addresses A3 to A5 designate the row addresses including the plane (for example, the plane PB0) and the page address which are subject to the register read. Furthermore, the memory device 1 receives the command C3 instructing the execution of the register read and CLE of the high level from the memory controller 2. In this manner, the core driver CDR reads the data in the data cache DCC0 of the column address designated by the addresses A1 and A2 of the plane PB0 designated by the addresses A3 to A5, to the shift register 221.

After the register read is instructed, the memory controller 2 toggles RE. Accordingly, the input-output circuit IOC transmits the data D0 to D2 in the shift register 221 to the memory controller 2 on the I/O line.

Figure 7:
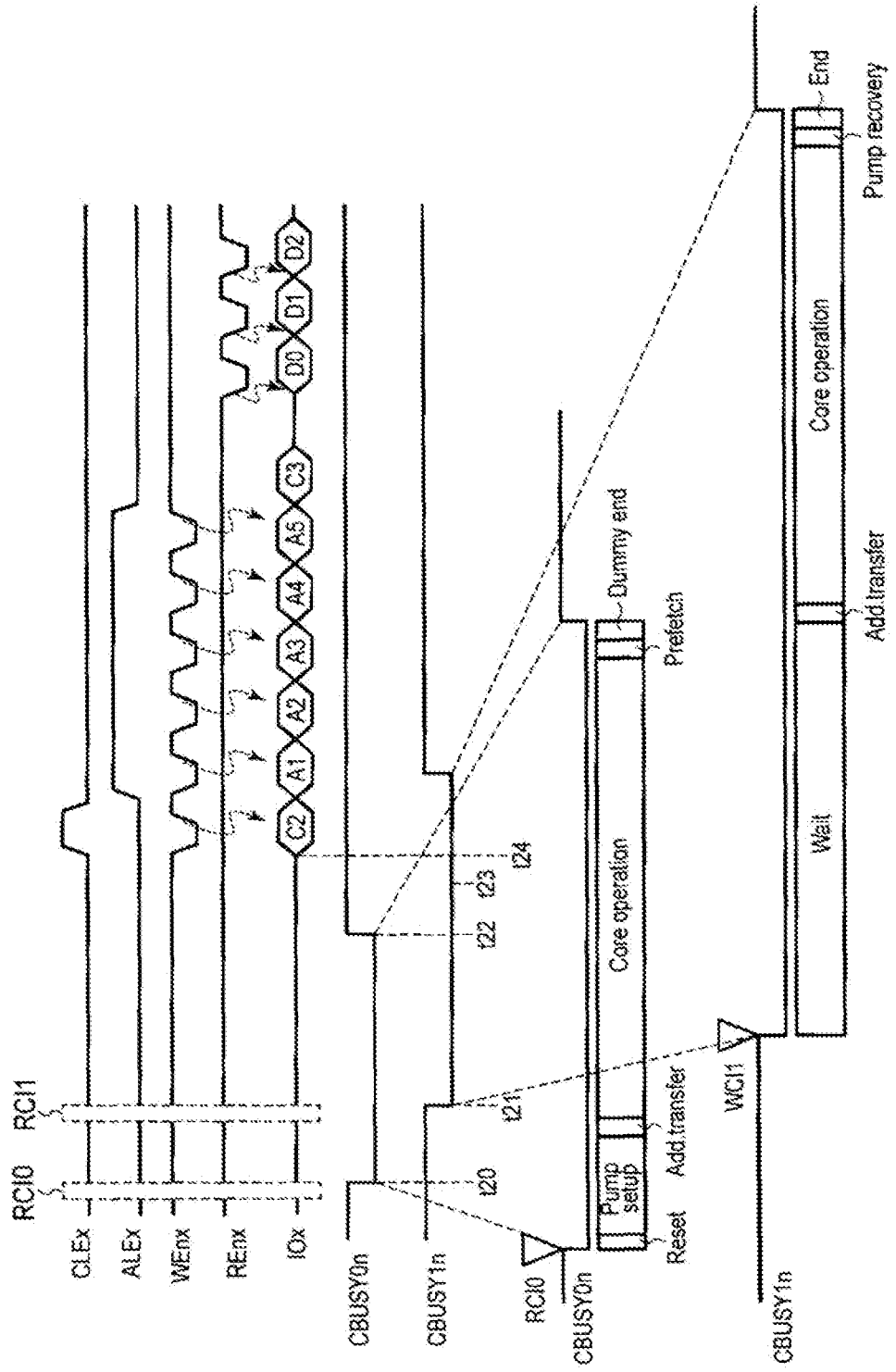
FIG. 7 illustrates a third example of the operation of the memory device according to the first embodiment.

As described above, in order to execute the receipt of the subsequent read command input RCI1 as the multi-plane read of the read command inputs RCI0 and RCI1, it is necessary that the receipt of the subsequent read command input RCI1 is executed before the address transfer regarding the read command input RCI0, and it is necessary that two read target pages are coincident with each other. FIG. 7 illustrates an operation when the condition thereof is not satisfied. FIG. 7 illustrates a third example of the operation of the memory device according to the first embodiment, and illustrates a signal flowing between the memory device 1 and the memory controller 2.

The memory device 1 receives the read command input RCI0 at time t20. In response to this, the core driver CDR starts the read regarding the plane PB0, and causes the signal CBUSY0 to be in the busy state.

The memory device 1 receives the read command input RCI1 at time t21. The time t21 is generated after the address transfer is started with regard to the plane PB0 using the preceding read command input RCI0. Therefore, the conversion determination circuit 231 determines that the processes of two read commands are not converted. Accordingly, the core driver CDR continues the process regarding the plane PB0, suspends the process regarding the plane PB1, and waits for the completion of the process regarding the plane PB0. The memory device 1 causes the signal CBUSY1 to be in the busy state from time t21.

The core driver CDR recognizes that the read command input RCI0 is executed as the single-plane read as instructed. Based on this, the core driver CDR performs the pre-fetch during the read regarding the plane PB0.

If the process regarding the plane PB0 is completed at time t22, the core driver CDR causes the signal CBUSY to return to the ready state, and starts the read regarding the plane PB1. However, the core driver CDR has already performed the reset and the pump setup during the read regarding the plane PB0. Therefore, the core driver CDR does not perform the reset and the pump setup again during the read regarding the plane PB1. Accordingly, the core driver CDR performs the address transfer and the core operation with regard to the plane PB1 from time t22, and then performs the pump recovery. The pre-fetch regarding the plane PB1 is not performed. For example, the reason is because the data in the shift register 221 with regard to the plane PB0 already stored may be damaged, when the data obtained as a result of the read of the preceding plane PB0 is continuously and frequently transferred to the shift register 221 for serial read, if the pre-fetch of the data read from the plane PB1 is performed on the grounds that the read regarding the plane PB1 is completed. As described above, when the data is transferred from the different plane PB (PB0) to the shift register 221 in the background, at the same time with the read of a certain plane PB (PB1), the pre-fetch is not performed with regard to the subsequent plane PB1. Alternatively, the above-described command C2 is separately used, thereby executing the register read from the data cache DCC1 to the shift register 221. If the core driver CDR completes the read regarding the plane PB1 at time t23, the control circuit CN causes the signal CBUSY1 to return to the ready state.

The memory controller 2 detects that any one of the signals CBUSY0 and CBUSY1 is in the ready state, and executes the register read from time t24. The memory controller 2 subsequently instructs the read from two planes, and recognizes a possibility that the process is not executed as the multi-plane read. Therefore, it is necessary to transfer the data to the shift register 221 as the preparation of the data output from the memory device 1. For this reason, the memory controller 2 executes the register read by designating the row address including the plane PB and the pages, similar to the multi-plane read, from time t24. That is, the memory controller 2 transmits the command C2 and CLE of the high level from time t24, then transmits the addresses A1 to A5 and ALE of the high level, and toggles WE. The row addresses A3 to A5 designate the row addresses including the plane (for example, the plane PB0) and the page address which are subject to the register read. After instructing the register read by designating the plane PB (and the page), the memory controller 2 toggles RE. In this manner, the input-output circuit IOC transmits the data D0 to D2 in the shift register 221 to the memory controller 2 on the I/O line.

In the second example, even when the timing requirement is satisfied, but two addresses are not coincident with each other, similar to the third example, the read regarding the plane PB1 is completed after a waiting state, and the address transfer regarding the plane PB1 is started after the read of the plane PB0 is completed.

Figure 8:
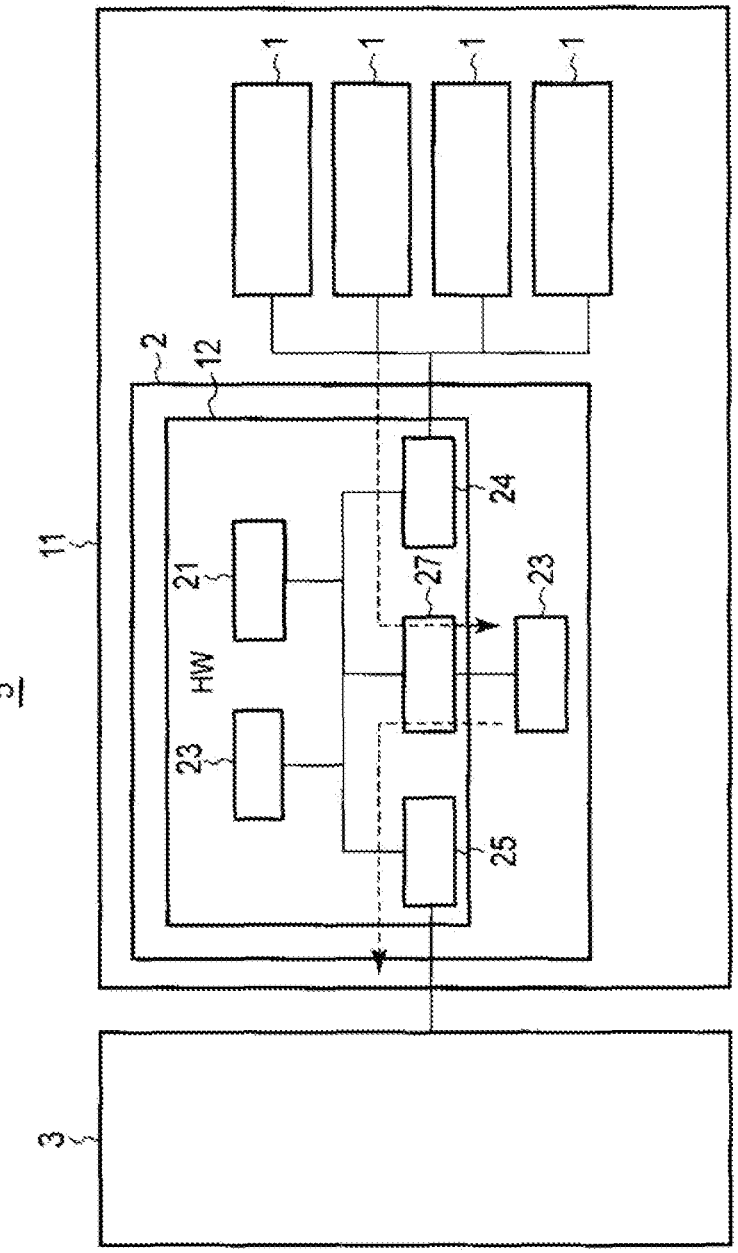
FIG. 8 illustrates another example of a memory system of the first embodiment.

Next, referring to FIGS. 8 and 9, an operation of a memory system of the memory device according to the first embodiment will be described. FIG. 8 illustrates another example of the memory system according to the first embodiment, and illustrates an example where the first embodiment has a memory system 5 including a solid state device (SSD) 11 and the host device 3. The SSD 11 includes the memory controller 2 and a plurality of memory devices 1. The processor 21, the ROM 22, and the interfaces 24, 25, 27 are configured as hardware 12.

Figure 9:
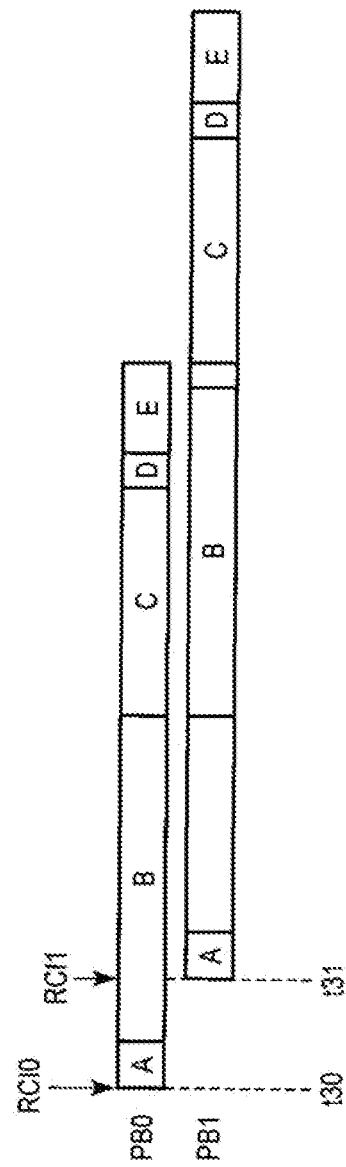
FIG. 9 illustrates an example of an operation of the memory system according to the first embodiment.

As illustrated in FIG. 9, a read request from the host device 3 in the memory system 5 mainly includes five stages A to E. The stage A is started by the read request from the host device 3, and is a stage where a process is executed by the memory controller 2 receiving the read request. In the stage A, the memory controller 2, that is, the CPU 21 operated in accordance with the program interprets the read request, and calculates a position (address) where requested data is held in the memory device 1. A solution to the data holding position includes the conversion of a logical address used in communication with the host device 3 by the memory controller 2 and a physical address indicating the actual (physical) address in the storage space of the memory device 1. The memory controller 2 uses the calculated address as the read target address, and instructs the read to the memory device 1. The read instruction is equivalent to the read command input RCI.

The stage B is a stage where a process instructed by the read instruction is executed in the memory device 1. The stage B is a stage where the read described with reference to FIGS. 5 to 7 is executed. The stage C is a stage of the data transfer from the memory device 1 to the memory controller 2. That is, the memory controller 2 first retrieves the data from the memory device 1 by issuing RE, as described with reference to FIGS. 5 to 7. As illustrated by a broken line in FIG. 8, the retrieved data is subjected to error correction using an error correction code (ECC) obtained by the program on the ROM 22 being executed by the processor 21, and then is held on the RAM 23.

The stage D is a stage for preparation of transferring the data on the RAM 23 to the host device 3. In the stage E, as also illustrated by the broken line in FIG. 8, the CPU 21 transfers the data on the RAM 23 to the host device 3 via the interface 25.

It is assumed that a different read request is issued as illustrated in FIG. 9 before the completion of the read request which causes a series of processes described above to start. That is, it is assumed that the host device 3 issues the read request relating to the read of the plane PB0 at time t30, and issues the read request relating to the read of the plane PB1 at time t31 in the midst of the stage B regarding the plane PB0.

The memory controller 2 executes the read command inputs RCI0 and RCI1 to perform two read requests. Even if the process is not executed as the multi-plane read as in the example of FIG. 6, the memory device 1 continuously executes the single read while omitting a part of the read as in the example of FIG. 7. By utilizing this, the memory system 5 (memory controller 2) may execute the stage B (read in the memory device 1) regarding the plane PB1, at the same time with the stage C (transfer to the memory controller 2) regarding the plane PB0. If the execution of the stage E regarding the plane PB0 is completed, the memory controller 2 start the execution of the stage C regarding the plane PB1.

Figure 10:
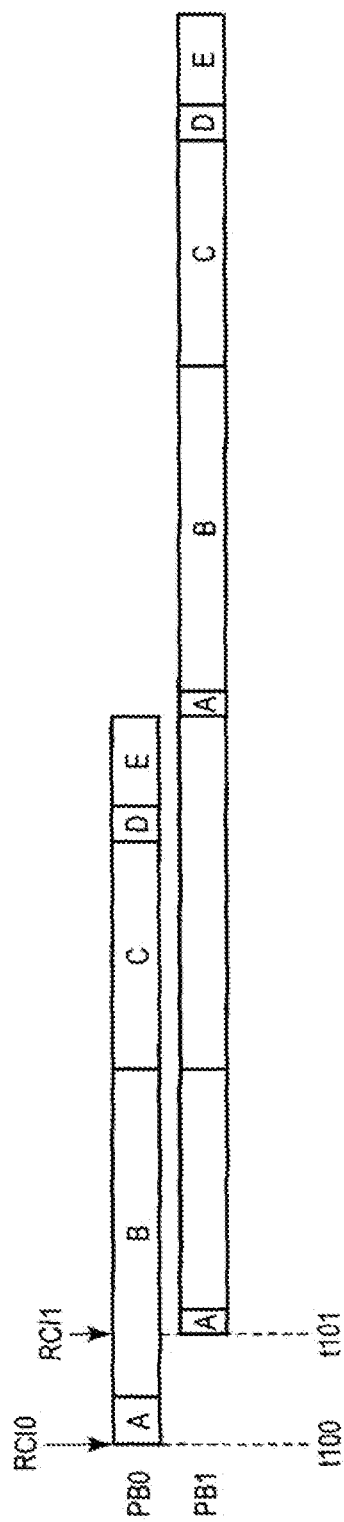
FIG. 10 illustrates a reference example of the operation of the memory system.

The process as illustrated in FIG. 9 is distinguished from the reference process illustrated in FIG. 10. FIG. 10 illustrates an operation of the system including the memory device which does not receive the instruction regarding a different plane during the process regarding a certain plane. The memory controller receives a read request relating to the read of the plane PB0 at time t100, executes the read command input RCI0 regarding the plane PB0, and waits for the completion of the process in the memory device, thereby remaining in the stage B. The memory controller receives the read request relating to the read of the plane PB1 at time 101. However, the memory device does not receive the read command input regarding the plane PB1. Accordingly, the memory controller does not execute the read command input regarding the plane PB1. The memory controller may interpret the read request and may calculate the address with regard to the plane PB1 during the stage B regarding the plane PB0 (first half of the stage A). However, the memory controller may instruct the read to the memory device for the first time after the completion of the stage E regarding the plane PB0 (second half of the stage A). Therefore, it takes longer time to complete the stage E regarding the plane PB1 as compared to the example illustrated in FIG. 9.

The reason why the memory device illustrated in FIG. 10 does not receive the instruction of the read in a certain plane during the read regarding a different plane is because the data caches regarding all the planes are to be reset if the instruction of the read regarding the subsequent plane is received. In contrast, in the memory device 1, it is separately managed for each plane whether or not the access to the data cache DCC is available as described above. Therefore, the receipt of the instruction of the read regarding the data cache DCC of a certain plane PB does not lead to the reset of the data cache DCC of the different plane PB, thereby enabling the process as illustrated in FIG. 9.

Figure 11:
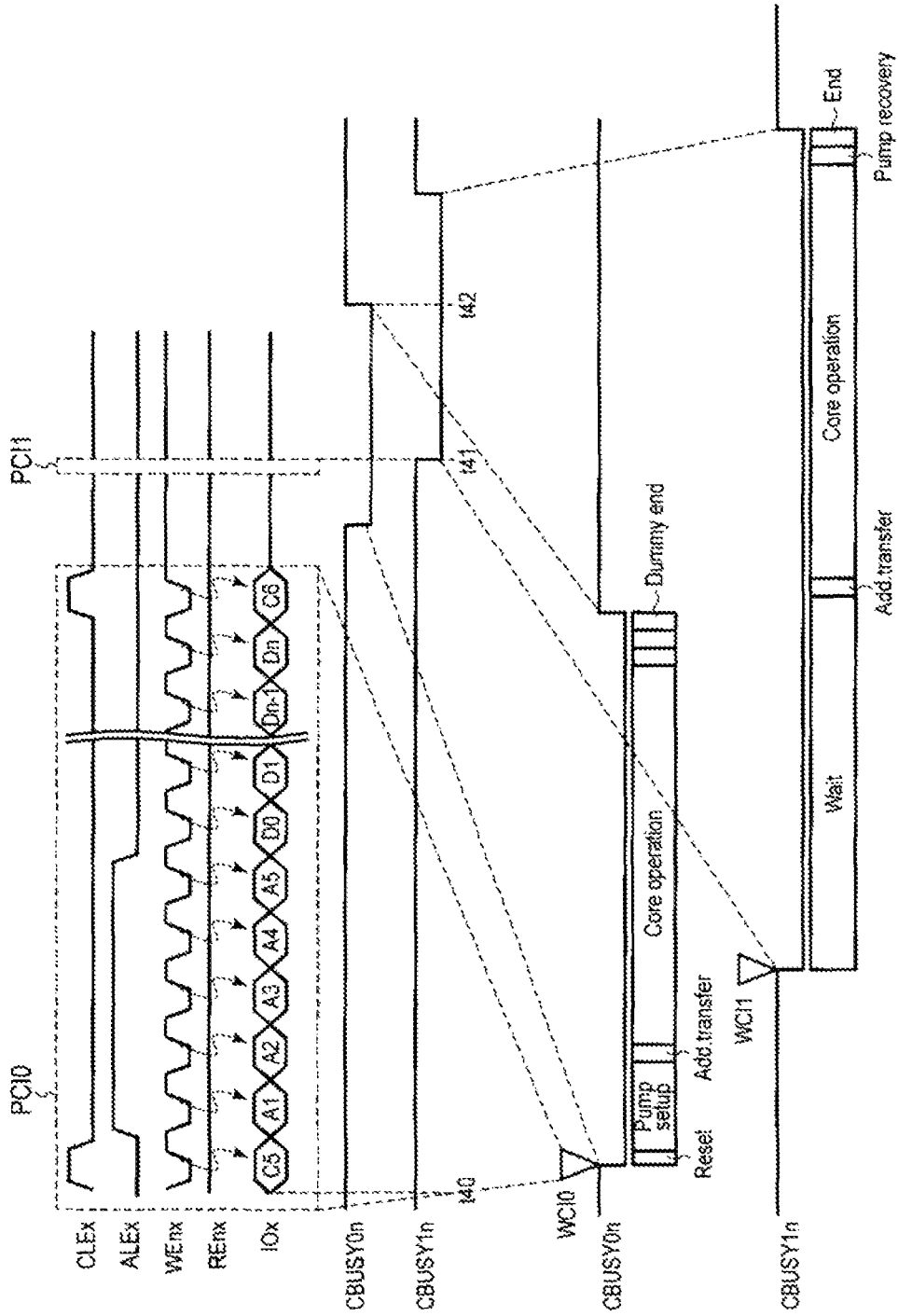
FIG. 11 illustrates a fourth example of the operation of the memory device according to the first embodiment.

FIG. 11 illustrates a fourth example of an operation of the memory device according to the first embodiment. FIG. 11 relates to a program. The program is also basically the same as the read. First, the memory controller 2 executes a program command input PCI0 with respect to the memory device 1 at time t40. The program command input PCI0 includes a program address transfer command C5, program addresses A1 to A5, data D0 to Dn (sign n is a natural number), and a program execution command C6. The program command input PCI0 is the same as the read command input RCI0 in that CLE, ALE, and WE become logically valid, at the same time with the flow of the command, the address, and the data on the I/O line.

When receiving the program command input PCI0, the memory device 1 executes the program. Similar to the read, the program includes the reset, the pump setup, the address transfer, the core operation, and the pump recovery. The reset, the pump setup, the address transfer, and the pump recovery are respectively similar to those in the read. The core operation includes at least the transfer of the program data to the data cache DCC0, and the application of predetermined electric potential to the word line WL, the bit line BL, and selection gate lines SGDL and SGSL which are executed by the core driver CDR. The data cache DCC0 is accessed by the program. Accordingly, the control circuit CN causes the signal CBUSY0 to be in the busy state when receiving the program command input PCI0. In contrast, the signal CBUSY1 indicates the ready state. The memory controller recognizes that the signal CBUSY1 is in the ready state, and then may start the program executed for the plane PB1. For this reason, the memory controller 2 executes the program command input PCI1 at time t41. The time t41 is in the midst of executing the core operation regarding the plane PB0. Therefore, the memory device 1 waits for the completion of the program regarding the plane PB0, and outputs the signal CBUSY1 indicating the busy state.

The control circuit CN completes the program regarding the plane PB0 at time t42, and causes the signal CBUSY0 to be in the ready state. The core driver CDR restarts the program regarding the plane PB1 at time t42. However, similar to the read, the core driver CDR does not execute the reset and the pump setup again during the program regarding the plane PB1. Accordingly, the core driver CDR executes the address transfer and the core operation with regard to the plane PB1 from time t42, and then executes the pump recovery. If the program regarding the plane PB1 is completed, the control circuit CN causes the signal CBUSY1 to return to the ready state.

As described above, the memory device according to the first embodiment has the pads 228 and 229 for outputting the dedicated cache busy signal CBUSY to each plane PB, and may receive the process (that is, the command) regarding the different plane PB in the cache ready state during the process regarding a certain plane PB. Therefore, the memory device 1 may use the different plane PB while the memory device 1 executes the process regarding a certain plane PB. For example, the memory device 1 may be used in order to temporarily hold some data. This may reduce the capacity of the cache executed by the RAM 23 in a controller (for example, the memory controller 2) used together with the memory device 1. In addition, the memory device 1 may receive the reservation of the read command input. Therefore, a device for controlling the memory device 1 (memory controller 2 and the like) may execute a plurality of processes, partially in parallel, thereby enabling an efficient process in the overall memory system 5.

In addition, the memory device 1 continuously executes the process regarding the plane PB which instructed after the completion of the process regarding the plane PB which is previously instructed. If the read regarding the different plane PB is instructed after the read regarding a certain plane PB is instructed so as to satisfy a specific condition, the memory device 1 executes these instructions as the multi-plane read. Therefore, it is possible to more efficiently execute parallel operations for the plurality of planes PB. Furthermore, the memory device according to the first embodiment omits a part of process regarding the subsequent plane, when the process regarding the plurality of planes PB is continuously executed. Therefore, it is possible to more quickly complete the continuous execution of the process regarding the plurality of planes. Even in a case of the program, an advantageous effect which is the same as that of the read may be obtained.

Second Embodiment

In a second embodiment, a pad indicating whether or not the cache is reserved is provided, and a signal indicating that the cache is reserved is communicated.

Figure 12:
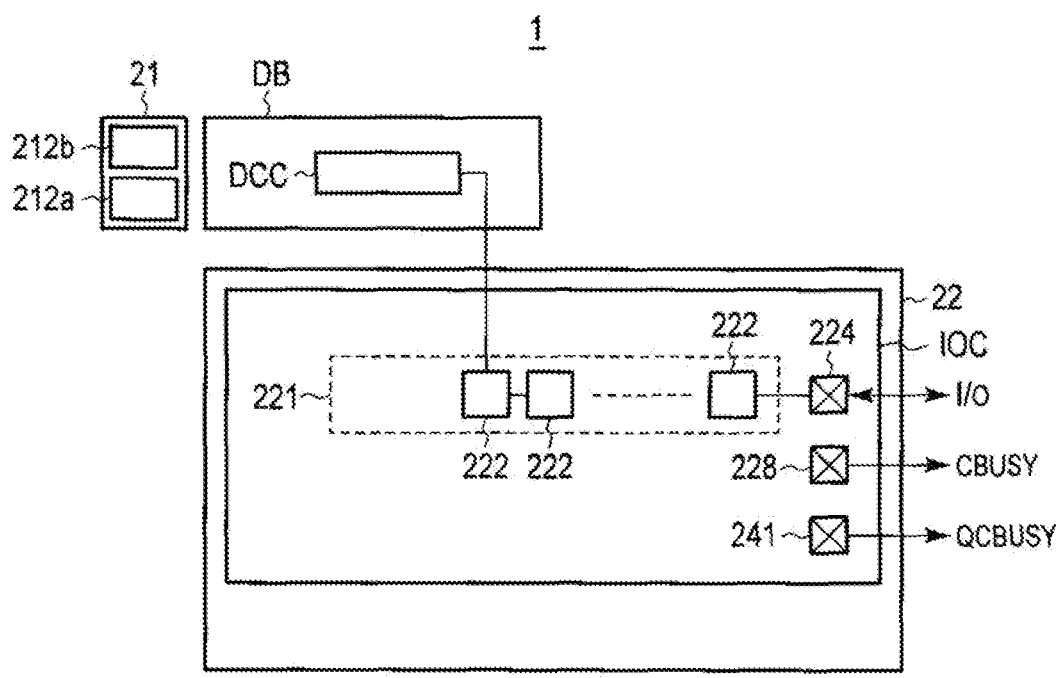
FIG. 12 illustrates functional blocks of a part of a memory device according to a second embodiment.

FIG. 12 illustrates functional blocks of a part of the memory device according to the second embodiment, and illustrates details of the input-output circuit IOC and the corner region 21. The input-output circuit IOC includes a queue cache busy pad 241 instead of the cache busy pad 229 in the first embodiment. The pad 241 outputs a queue cache busy signal QCBUSY. In addition, the corner region 21 includes address registers 212a and 212b. In order to simplify the description and to facilitate the understanding, the second embodiment relates to an example where the memory device 1 has one plane PB. Based on this, there is provided the cache busy signal CBUSY regarding one plane PB.

Figure 13:
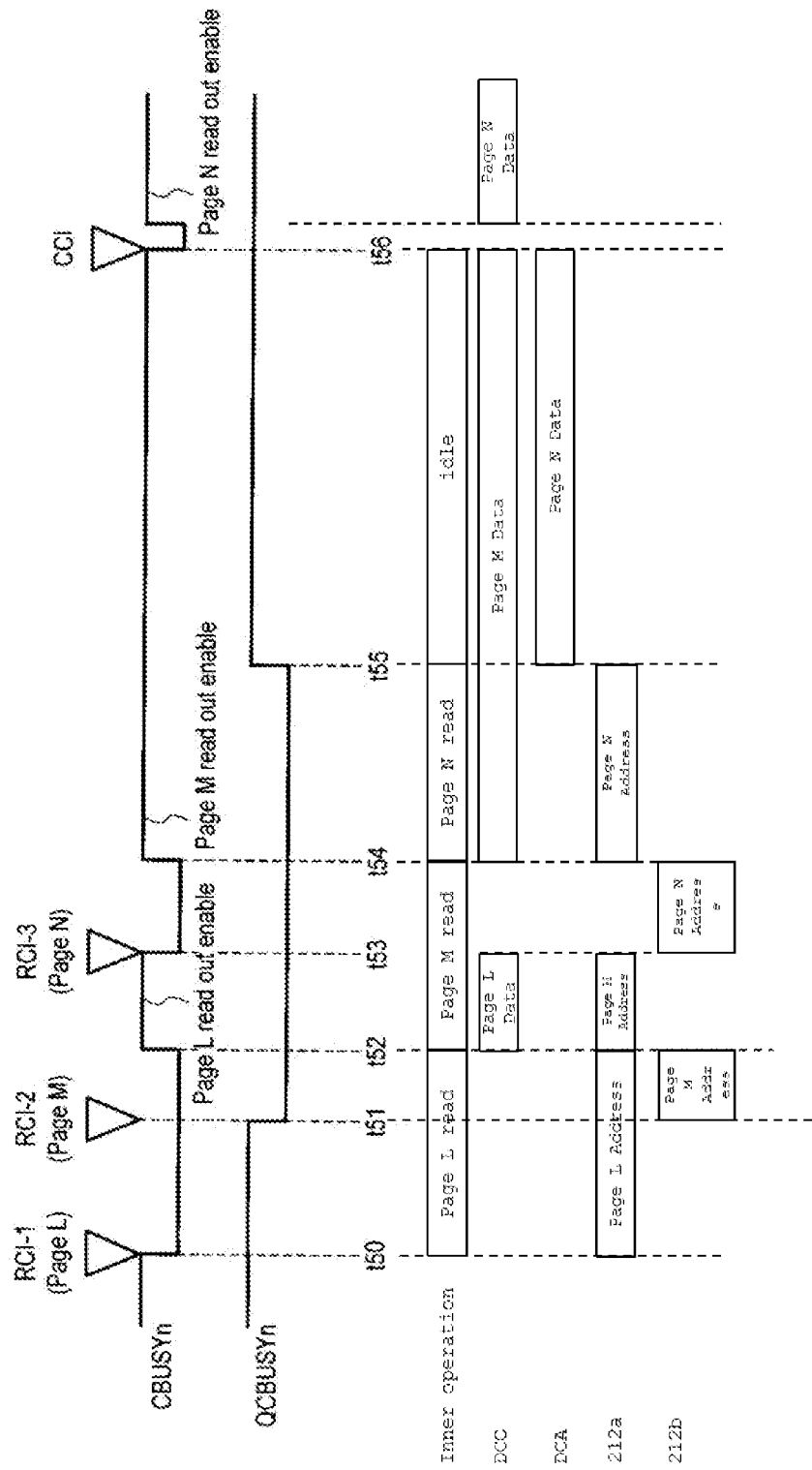
FIG. 13 illustrates an example of an operation of the memory device according to the second embodiment.

FIG. 13 illustrates an example of an operation of the memory device according to the second embodiment. At time t50, the memory controller 2 executes a read command input RCI-1 in which a page L is a reading target, with respect to memory device 1. In response to this, the control circuit CN causes the signal CBUSY to be in the busy state from time t50, and executes the read from time t50. During the read, the address regarding the read command input RCI-1 is transferred to a vacant register between two address registers 212a and 212b. In the example illustrated herein, the address (page L address) is transferred to the address register 212a and the address register 212b is vacant, as shown in FIG. 13. The control circuit CN maintains the signal QCBUSY to be in the high level at the time point of time t50.

At time t51, the memory controller 2 executes a read command input RCI-2 in which a page M is a reading target, with respect to memory device 1. Then, the memory device 1 executes the read after finishing the read of the page L. Although the signal CBUSY is in the busy state at time t51, the signal QCBUSY is in the ready state. Therefore, the memory device 1 may receive the reservation of the subsequent read command input RCI. That is, the memory device 1 transfers the address in a different read command input RCI which is received during the process of a certain read command input RCI to the address register 212a or 212b which is vacant (for example, the address register 212b), and waits. In addition, the memory device 1 causes the signal QCBUSY to be in the busy state (queue busy state) from time t51. The memory device 1 does not receive the read command input RCI while the signals BUSY and QCBUSY are both in the busy state. That is, while the memory device 1 has the read command input RCI whose process is not completed and waits for the subsequent read that has been reserved, the memory device 1 does not receive another read command input RCI.

At time t52, the memory device 1 completes the read regarding the read command input RCI-1, and the memory controller 2 is in a state of retrieving the data (data of the page L) regarding the read command input RCI-1. The page M address data stored in the address register 212b is transferred to the address register 212a. At this time, the address registers 212b is vacant. Accordingly, the memory device 1 causes the signal CBUSY to be in the ready state. If the signal CBUSY is in the ready state, the memory device 1 may receive the read command input RCI. From time t52, the core driver CDR continuously executes the read regarding the read command input RCI-1, and executes the read regarding the read command input RCI-2. At this time, as described in the first embodiment, two reads are continuously executed. In the second read, the reset and the pump setup are not executed. Therefore, it is possible to quickly complete the subsequent read.

At time t53, the memory controller 2 executes a read command input RCI-3 in which a page N is a reading target, with respect to the memory device 1.

At this time, the signal CBUSY is in the ready state. Accordingly, the memory device 1 receives the read command input RCI-3. The address in the read command input RCI-3 is transferred to the address register 212a or 212b which is vacant. In the example illustrated herein, the address (page N address) is transferred to the address register 212a, as shown in FIG. 13. The control circuit CN causes the signal CBUSY to be in the busy state at time t53, based on that the read command input RCI-3 is executed.

At time t54, the memory device 1 completes the read regarding the read command input RCI-2, and the memory controller 2 is in a state of retrieving the data (data of the page M) regarding the read command input RCI-2. Accordingly, the memory device 1 causes the signal CBUSY to be in the ready state. There is no more reserved read command input RCI. Therefore, at time t55 after the lapse of a certain time period from time t54, the memory device 1 may receive another read command input RCI. Accordingly, the control circuit CN causes the signal QCBUSY to return to the ready state.

FIG. 13 illustrates that a cache data transfer command input CCI is further executed at time t56. When the continuous read is completed through the read of the page N, the data of the page M is in a state of being held in the data cache DCC. The data of the page M is held in the sense amplifier SA. Therefore, the cache data transfer command input CCI is required in order to transfer the data of the page M from the data cache 133 to the data cache DCC. When receiving the cache data transfer command input CCI, the memory device 1 causes the signal CBUSY to be in the busy state, transfers the data of the page M from the data cache 133 to the data cache DCC, and causes the signal CBUSY to return to the ready state. In this manner, the memory controller 2 is in a state of retrieving the data of the page M.

Figure 14:
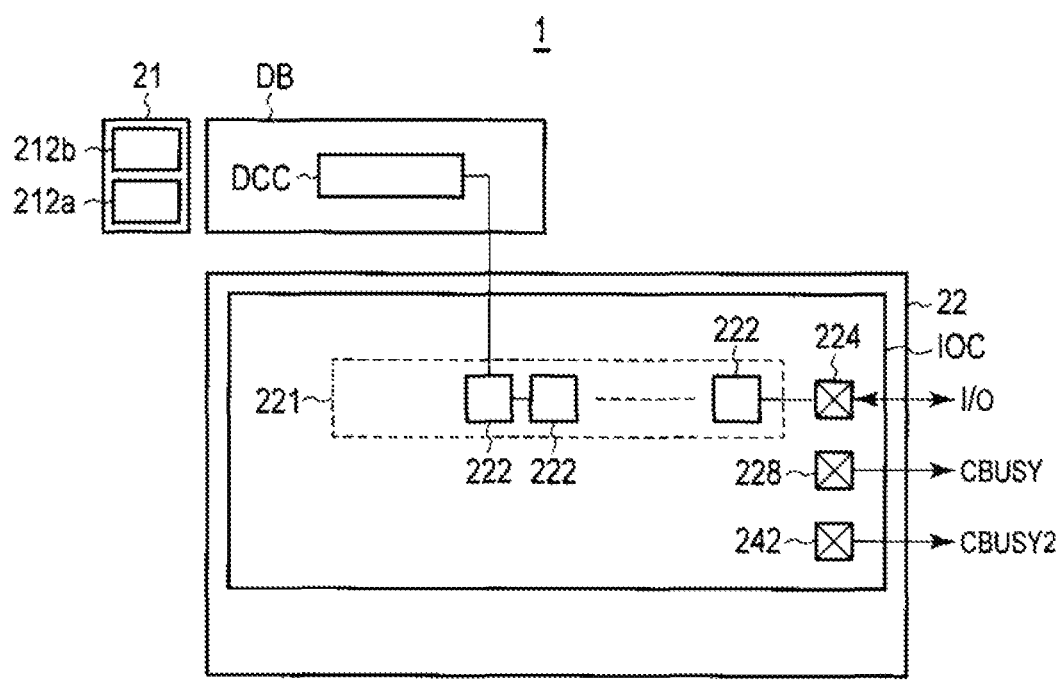
FIG. 14 illustrates another example of functional blocks of a part of the memory device according to the second embodiment.

FIG. 14 illustrates a second example of the functional blocks of a part of the memory device according to the second embodiment, and illustrates details of the input-output circuit IOC and the corner region 21. FIG. 13 also relates to an example where the memory device 1 has one plane. The input-output circuit IOC includes a cache busy pad 242 instead of the queue cache busy pad 241 in the example illustrated in FIG. 13. The pad 242 outputs a cache busy signal CBUSY2. According to the example illustrated in FIG. 14, it is possible to achieve the operation which is the same as that in the examples in FIGS. 12 and 13.

Figure 15:
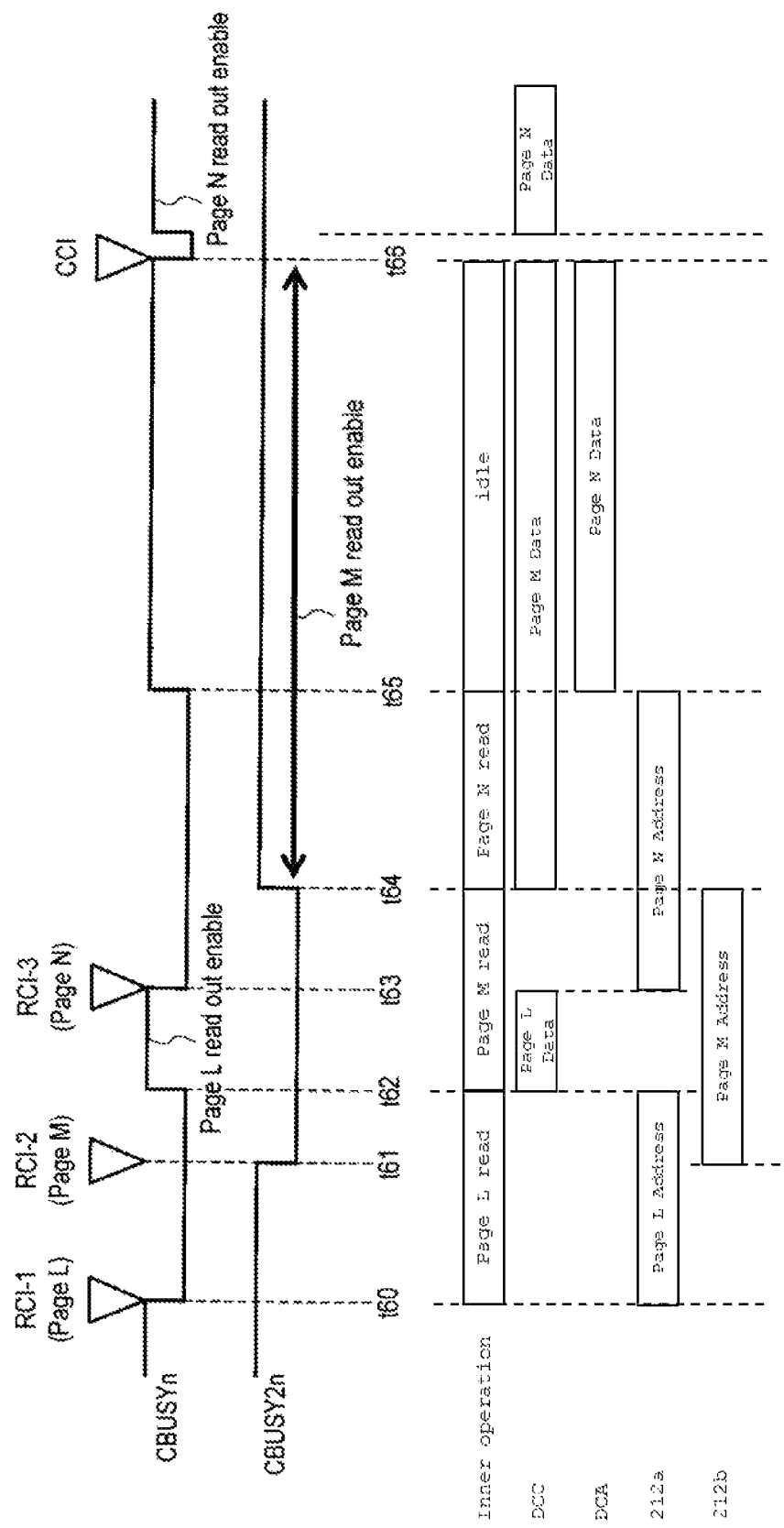
FIG. 15 illustrates another example of the operation of the memory device according to the second embodiment.

FIG. 15 illustrates an operation of the second example of the memory device according to the second embodiment. The process at time t60 is the same as the process at time t50. At subsequent time t61, similar to a case at time t51, the memory controller 2 execute a read command input RCI-1 in which the page M is a read target, with respect to the memory device 1. At the time point of time t61, the memory device 1 has already executed the read. Although the signal CBUSY is in the busy state, the signal CBUSY2 is in the ready state. Therefore, the memory device 1 may receive the reservation of the subsequent read command input RCI. That is, similar to the case at time t51 in FIGS. 12 and 13, the memory device 1 transfers the address in a different read command input RCI received during the process of a certain read command input RCI to the address register 212a or 212b which is vacant, and waits. In addition, the memory device 1 causes the second cache busy signal CBUSY2 to be in the busy state. The memory device 1 does not receive the read command input RCI while the signals CBUSY and CBUSY2 are both in the busy state.

The process at time t62 is the same as the process at time t52. At time t63, similar to the case at time t53, the memory controller 2 executes the read command input RCI-3 in which the page N is a read target, with respect to the memory device 1. At this time, when any one of two signals CBUSY and CBUSY2 is in the ready state, the memory device 1 receives the read command input RCI-3, and then executes the process which is the same as the process at time t53. There is no more reserved read command input RCI. Therefore, at time t64 after the lapse of a certain time period from time t63, the memory device 1 may receive another read command input RCI. Accordingly, the control circuit CN causes the signal CBUSY2 to return to the ready state. At time t64, the memory device 1 completes the read for the read command input RCI-2. Therefore the memory controller 2 is in a state of retrieving the data (data of the page M) regarding the read command input RCI-2 from the time t64.

At time t65, the memory device 1 completes the read for the read command input RCI-3. Accordingly, the memory device 1 causes the signal CBUSY to be in the ready state. The subsequent process at time t66 is the same as the process at time t56.

As described above, the memory device according to the second embodiment may receive the reservation of the read command input RCI even if the memory device has the read command input RCI whose process is not completed. It is possible to indicate whether or not the read command input RCI is reserved, by using the signal QCBUSY or CBUSY2 in addition to the cache busy signal CBUSY. The read regarding the reserved read command input RCI is continuously executed in the read regarding the read command which is in the processing. The memory device 1 may receive the reservation of the read command input RCI. Therefore, a device for controlling the memory device 1 (memory controller 2 and the like) may execute a plurality of processes, partially in parallel, thereby enabling an efficient process in the overall memory system 5.

When a plurality of reads is continuously executed, a process regarding the following read is partially omitted. Accordingly, similar to the case where the processes regarding the plurality of planes are continuously executed in the first embodiment, it is possible to more quickly complete the execution for the plurality of reads.

Third Embodiment

A third embodiment relates to a modification of the first and second embodiments, and relates to another example of the signals QCBUSY and CBUSY2 of the second embodiment and signals CBUSY0 and CBUSY1 of the first embodiment.

Figure 16:
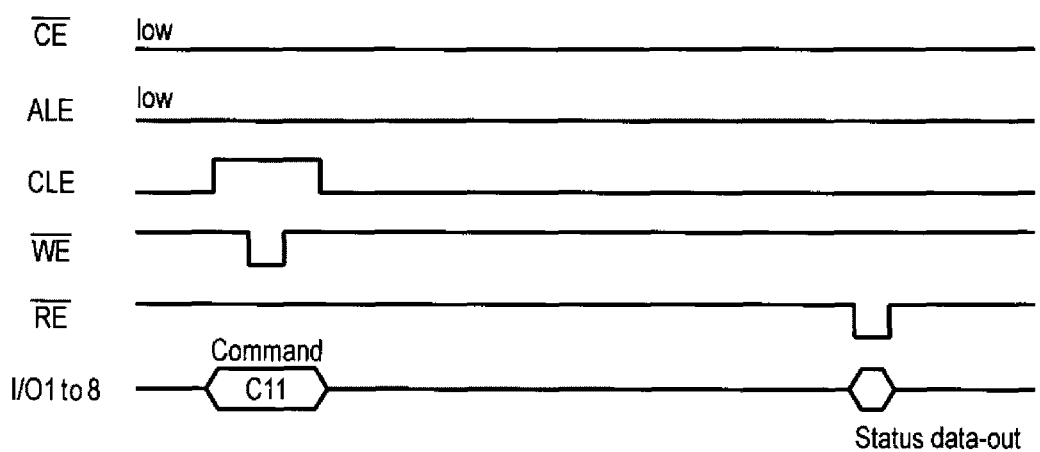
FIG. 16 illustrates flow of a signal for status read according to a third embodiment.

Without using the dedicated pads 228, 229, and 241 as described above, notification of the signals CBUSY0, CBUSY1, QCBUSY, and CBUSY2 may be performed by status read. That is, as illustrated in FIG. 16, the memory device 1 outputs status data via the I/O line, when receiving a status read command. The status data includes a plurality of bits, for example eight bits. Information of the signals CBUSY0, CBUSY1, CBUSY, QCBUSY, and CBUSY2 is allocated to any one of the plurality of bits of the status data. FIG. 17 illustrates an allocation example of the bits of the status data according to the third embodiment, and illustrates an example of a relationship between the information indicating states including a state indicated by the signals CBUSY0 and CBUSY1 according to the first embodiment and the bits of the status data. I/O[0] to I/O[7] correspond to the bit in the status data output by the status read command used in the memory device 1 which may notify a state by using the signals CBUSY0 and CBUSY1 as in the first embodiment, and respectively correspond to eight bits in the I/O line.

For example, I/O[0] is not used. I/O[1] and I/O[2] respectively indicate true ready/busy of the planes PB0 and PB1, and respectively indicate ready and busy by using "1" and "0", for example. The true busy indicates that a certain operation is performed inside the memory device 1. When a certain operation is performed inside the planes PB0 and PB1, I/O[1] and I/O[2] respectively indicate "0". More details are as follows. The ready/busy state of the semiconductor memory device has two types. The memory device 1 according to the embodiments also has two types of ready/busy state of the chip. For example, a case will be described where the memory device 1 is instructed to execute the read for multiple continuous pages. If the data read from a certain page is transferred to the data cache DCC and then the pre-fetch to the shift register 221 is completed, the state becomes cache ready. Therefore, the data from the memory device 1 to the memory controller 2 may be output. During this time, those other than the data cache DCC and the shift register 221 are in an inactive state. Accordingly, the memory device 1 may execute the core operation such as the read using the data caches (for example, data caches DCA and DCB) other than the data cache DCC. Therefore, a command to automatically start the read the subsequent page after the read of a certain page is executed is prepared. An operating method of reducing the inactive state as much as possible by executing the core operation (for example, the read) for a different page in the background whereas the memory controller 2 may output the data of a certain page in the foreground is called a cache operation. In this example, the operating method is the cache operation regarding the read, and thus, is also called cache read. This state is cache ready. In contrast, this state represents a state where the core operation is executed by using those other than a circuit for an access to the data cache, and is called a true busy state. As illustrated in FIG. 5, in the read where the cache operation is not executed, the cache busy is equal to the true busy.

I/O[3] indicates a value ("0") indicating busy if at least any one between I/O[1] and I/O[2] indicates busy, and indicates "1" if not. I/O[4] and I/O[5] respectively indicate cache ready/busy for the planes PB0 and PB1, respectively correspond to the signals CBUSY0 and CBUSY1, and respectively indicate ready and busy by using "1" and "0", for example. That is, in the status data in which the signals CBUSY0 and CBUSY1 are output during the busy state in the first embodiment, I/O[4] and I/O[5] respectively indicate "0". I/O[6] indicates a value ("0") indicating busy if at least any one between I/O[4] and I/O[5] indicates busy, and indicates "1" if not.

I/O[7] indicates able and disable of write protect. For example, if the write is protected, I/O[7] indicates "0". If the write is not protected, I/O[7] indicates "1".

If the status read command is input to the memory device 1 which outputs the status data illustrated in FIG. 17, the memory device 1 outputs the status data of FIG. 17 in which each bit has a value determined based on the state thereof. For example, if the status read data indicates that the plane PB0 indicates cache busy and the plane PB1 indicates cache ready, that is, if I/O[4] and I/O[5] respective indicate "0" and "1", the access to the data cache DCC1 of the plane PB1 is possible.

FIG. 18 illustrates a second allocation example of the bits of the status data according to the third embodiment, and illustrates an example of a relationship between the information indicating states including a state indicated by the signals CBUSY and QCBUSY according to the second embodiment and the bits of the status data. I/O[0] to I/O[7] correspond to the bit in the status data output by the status read command used in the memory device 1 which may notify a state by using the signals CBUSY and QCBUSY as in the second embodiment, and respectively correspond to eight bits in the I/O line.

For example, I/O[0] indicates chip N status, and indicates whether a program or erase passes or fails after the program or the erase is completed in the memory device 1. For example, I/O[0] indicates the pass and the fail, respectively by using "0" and "1". I/O[1] indicates chip N-1 status, and indicates whether the program for the preceding page passes or fails when there are two continuous page program. For example, I/O[1] indicates the pass and the fail, respectively by using "0" and "1". For example, I/O[2] and I/O[3] are not used.

I/O[4] indicates cache ready/busy, and for example, indicates ready and busy, respectively by using "1" and "0". I/O[4] corresponds to the signal QCBUSY. That is, I/O[4] indicates "0" in the status data where the signal QCBUSY is output during the busy state in the second embodiment. I/O[5] indicates true ready/busy, and is the same as that illustrated in FIG. 17. I/O[6] indicates cache ready/busy, and for example, indicates ready and busy, respectively by using "1" and "0". I/O[6] corresponds to the signal QCBUSY. That is, I/O[6] indicates "0" in the status data where the signal QCBUSY is output during the busy state in the second embodiment. I/O[7] indicates write protect, and is the same as that illustrated in FIG. 17.

FIG. 19 illustrates a third allocation example of the bits of the status data according to the third embodiment, and illustrates an example of a relationship between the information indicating states including a state indicated by the signals CBUSY and CBUSY2 according to the second embodiment and the bits of the status data. I/O[0] to I/O[7] correspond to the bit in the status data output by the status read command used in the memory device 1 which may notify a state by using the signals CBUSY and CBUSY2 as in the second embodiment, and respectively correspond to eight bits in the I/O line.

For example, I/O[0] and I/O[1] indicate chip N status and chip N-1 status, and are the same as those illustrated in FIG. 18. For example, I/O[2] and I/O[3] are not used. I/O[4] indicates true ready/busy, and is the same as that illustrated in FIG. 18. I/O[5] indicates second cache ready/busy, and for example, indicates ready and busy, respectively by using "1" and "0". I/O[5] corresponds to the signal CBUSY2. That is, I/O[5] indicates "0" in the status data where the signal CBUSY2 is output during the busy state in the second embodiment. I/O[6] indicates cache ready/busy, and for example, indicates ready and busy, respectively by using "1" and "0". I/O[6] corresponds to the signal CBUSY. That is, I/O[6] indicates "0" in the status data where the signal CBUSY is output during the busy state in the second embodiment. I/O[7] indicates write protect, and is the same as that illustrated in FIG. 17.

As described above, the memory device according to the third embodiment is based on the first or second embodiment. The memory device according to the third embodiment is capable of notifying a state indicated by the signals CBUSY0 and CBUSY1 of the first embodiment or the signals CBUSY, QCBUSY, and CBUSY2 of the second embodiment by using the status read and the status data. Therefore, an advantageous effect which is the same as that of the configuration based on the third embodiment between the first and second embodiments may be obtained.

In addition, the respective embodiments are not limited to those described above. The respective embodiments may be modified in various ways in an embodying stage without departing from the spirit of the invention. Furthermore, the above-described embodiments include various stages. Various embodiments may be extracted by appropriately combining a plurality of configuring elements disclosed herein. For example, even when some configuring elements are deleted from all the configuring elements described in the above-described respective embodiments, a configuration from which the configuring elements are deleted may be extracted as an embodiment.

When the memory device 1 according to the present embodiments is a NAND-type flash memory, the following operation and configuration may be employed.

(1) In a read operation (read) of multi-valued levels, if an A level, a B level, and a C level are arranged sequentially from the level having the lowest threshold voltage, a voltage applied to the word line selected for the read operation of the A level is in a range of 0 V to 0.55 V, for example. Without being limited thereto, the voltage may be in any range of 0.1 V to 0.24 V, 0.21 V to 0.31 V, 0.31 V to 0.4 V, 0.4 V to 0.5 V, and 0.5 V to 0.55 V.

A voltage applied to the word line selected for the read operation of the B level is in a range of 1.5 V to 2.3 V, for example. Without being limited thereto, the voltage may be in any range of 1.75 V to 1.8 V, 1.8 V to 1.95 V, 1.95 V to 2.1 V, and 2.1 V to 2.3 V.

A voltage applied to the word line selected for the read operation of the C level is in a range of 3.0 V to 4.0 V, for example. Without being limited thereto, the voltage may be in any range of 3.0 V to 3.2 V, 3.2 V to 3.4 V, 3.4 V to 3.5 V, 3.5 V to 3.7 V, and 3.7 V to 4.0 V.

Time (tR) for the read operation may be in any range of 25 µs to 38 µs, 38 µs to 70 µs, and 70 µs to 80 µs.

(2) A write operation includes a program operation and a verify operation. In the write operation, a voltage first applied to the word line selected during the program operation is in a range of 13.7 V to 14.3 V, for example. Without being limited thereto, for example, the voltage may be in any range of 13.7 V to 14.0 V and 14.0 V to 14.7 V.

The voltage first applied to the selected word line during the write of the odd-numbered word line may be changed to the voltage first applied to the selected word line during the write of the even-numbered word line.

When the program operation uses an incremental step pulse program (ISPP) method, a step-up voltage may be approximately 0.5 V, for example.

A voltage applied to the non-select word line may be in a range of 7.0 V to 7.3 V, for example. Without being limited to this case, the voltage may be in a range of 7.3 V to 8.4 V, or alternatively, may be 7.0 V or less.

An applying pass voltage may be changed depending on whether the non-select word line is the odd-numbered word line or depending on whether the non-select word line is the even-numbered word line.

Time (tProg) for the write operation may be in any range of 1,700 µs to 1,800 µs, 1,800 µs to 1,900 µs, and 1,900 µs to 2,000 µs, for example.

(3) In an erase operation, a voltage first applied to a well which is formed in an upper portion of a semiconductor substrate and where the memory cell is arranged above is in a range of 12 V to 13.7 V, for example. Without being limited to this case, the voltage may be in any range of 13.7 V to 14.8 V, 14.8 V to 19.0 V, 19.0 V to 19.8 V, and 19.8 V to 21 V.

Time (tErase) for the erase operation may be in any range of 3,000 µs to 4,000 µs, 4,000 µs to 5,000 µs, and 4,000 µs to 9,000 µs, for example.

(4) The memory cell has a charge storage layer arranged on the semiconductor substrate (silicon substrate) via a tunnel insulating film having the film thickness of 4 nm to 10 nm. This charge storage layer may have a layer structure of an insulating film made of SiN or SiON which has the film thickness of 2 nm to 3 nm and polysilicon having the film thickness of 3 nm to 8 nm. Metals such as Ru may be added to the polysilicon. The insulating film is formed on the charge storage layer. For example, the insulating film has a silicon oxide film which has the film thickness of 4 nm to 10 nm and which is interposed between a lower layer High-k film having the film thickness of 3 nm to 10 nm and an upper layer High-k film having the film thickness of 3 nm to 10 nm. The High-k film includes HfO. In addition, the film thickness of the silicon oxide film may be thicker than the film thickness of the High-k film. A control electrode having the film thickness of 30 nm to 70 nm is formed on the insulating film via a work function adjusting material having the film thickness of 3 nm to 10 nm. Here, the work function adjusting material is a metal oxide film made of TaO or a metal nitride film made of TaN. As the control electrode, W may be used.

In addition, an air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
first and second memory cell arrays;
a control circuit configured to output first information indicating whether the first memory cell array is in a ready state in which the control circuit is ready to receive a command to access the first memory cell array or a busy state in which the control circuit is not ready to receive the command to access the first memory cell array, and second information indicating whether the second memory cell array is in a ready state in which the control circuit is ready to receive a command to access the second memory cell array or a busy state in which the control circuit is not ready to receive the command to access the second memory cell array, wherein the control circuit includes a first pad through which the first information is output and a second pad through which the second information is output; and first and second caches that respectively hold data transferred from the first and second memory cell arrays, wherein when the first information indicates that the first memory cell array is in the ready state, the first cache is accessible from outside the device, when the second information indicates that the second memory cell array is in the ready state, the second cache is accessible from outside the device, and when the control circuit receives a first command to access the first memory cell array and a second command to access the second memory cell array after receiving the first command, the control circuit is configured to perform a process instructed by the first command and then perform a process instructed by the second command within a time period that is shorter than two times a time period for completing the process instructed by the first command.

2. The device according to claim 1, wherein if the first command and the second command accesses a same page in the first and second memory cell arrays, the same page in the first and second memory cell arrays are accessed at the same time.

3. The device according to claim 1, wherein, while the control circuit is executing the process instructed by the first command, the control circuit suspends the process instructed by the second command so that the same page in the first and second memory cell arrays can be accessed at the same time.

4. The device according to claim 1, wherein if the first command and the second command accesses a different page in the first and second memory cell arrays, a page in the first memory cell array is accessed and thereafter a page in the second memory cell array is accessed.

5. The device according to claim 1, wherein the first information and the second information are output as a series of status bits.

6. A semiconductor memory device, comprising:

first and second memory cell arrays; and a control circuit configured to output first information indicating whether the control circuit is in a first ready state or a first busy state and second information indicating whether the control circuit is in a second ready state or a second busy state, wherein the control circuit is ready to receive a first command to access the first memory cell array when in the first ready state and is not ready to receive the first command when in the first busy state, the control circuit is ready to receive a second command to access the second memory cell array when in the second ready state and not ready to receive the second command when in the second busy state, the control circuit is configured to output the first information indicating the control circuit is in the first busy state after the semiconductor memory device receives the first command and to perform a first core operation in the first memory cell array while in the first busy state, and the control circuit is configured to be able to receive the second command while in the first busy state, wait until the first core operation is finished, and then perform a second core operation in the second memory cell array.

7. The device according to claim 1, wherein the control circuit is configured to perform the second core operation once the control circuit outputs the first information indicating the control circuit is in the first ready state after the first core operation is finished.

8. The device according to claim 1, wherein the control circuit is configured to output the second information indicating the control circuit is in the second busy state after receiving the second command.

9. The device according to claim 1, wherein the control circuit is configured to perform a first pre-fetch operation and a first dummy end operation while in the first busy state.

10. The device according to claim 9, wherein the control circuit is configured to perform a second address transfer operation after performing the first dummy end operation and before performing the second core operation.

11. The device according to claim 6, wherein the first and second core operations are read operations.

12. The device according to claim 6, wherein the first information and the second information are output as a series of status bits.

13. The device according to claim 6, wherein the control circuit includes a first pad through which the first information is output and a second pad through which the second information is output.

14. The device according to claim 6, wherein the control circuit is configured to perform an operation instructed by the first command and then perform an operation instructed by the second command within a time period that is shorter than two times a time period for completing the operation instructed by the first command.

15. The device according to claim 6, wherein the control circuit includes a first register for storing an address specified in the first command and a second register for storing an address specified in the second command.

* * * * *